US007719872B2

(12) United States Patent
Kato

(10) Patent No.: US 7,719,872 B2
(45) Date of Patent: May 18, 2010

(54) WRITE-ONCE NONVOLATILE MEMORY WITH REDUNDANCY CAPABILITY

(75) Inventor: Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 515 days.

(21) Appl. No.: 11/612,069

(22) Filed: Dec. 18, 2006

(65) Prior Publication Data

US 2007/0147129 A1 Jun. 28, 2007

(30) Foreign Application Priority Data

Dec. 28, 2005 (JP) ............................ 2005-377260

(51) Int. Cl.
*G11C 17/14* (2006.01)

(52) U.S. Cl. ....................... 365/104; 365/103; 365/100; 365/148; 365/163; 365/200; 365/201; 365/151; 365/153; 365/233.1; 365/192; 365/197; 365/198

(58) Field of Classification Search ................. 365/104, 365/103, 100, 148, 163, 96, 94, 185.09, 185.22, 365/200, 201, 233.16, 233.17, 233.19, 151, 365/153, 233.1, 192, 197, 198, 191
See application file for complete search history.

(56) References Cited

U.S. PATENT DOCUMENTS 5,402,377 A 3/1995 Ohhata et al.
5,452,251 A 9/1995 Akaogi et al.
5,798,534 A 8/1998 Young
6,178,124 B1 * 1/2001 Kaiser et al. ................ 365/200
6,362,502 B1 3/2002 Rösner et al.
6,633,504 B1 * 10/2003 Lee et al. .................... 365/222
6,967,878 B2 11/2005 Dono
7,358,590 B2 * 4/2008 Yukawa et al. .............. 257/530

(Continued)

FOREIGN PATENT DOCUMENTS

JP 56-044198 4/1981

(Continued)

OTHER PUBLICATIONS

Brent Keeth et al.; "DRAM: Circuit Design—A Tutorial"; IEEE Press; pp. 108-109; 2001.

(Continued)

*Primary Examiner*—Andrew Q Tran
(74) *Attorney, Agent, or Firm*—Fish & Richardson P.C.

(57) ABSTRACT

A nonvolatile memory, such as a write-once memory, includes a memory cell array that has first memory cells and at least one second memory cell. The memory also includes a first writing circuit that is capable of writing data to the first memory cells and the second memory cell, a second writing circuit, and a verify circuit which is capable of confirming whether the data is normally stored in the first memory cells. When the writing of data to one of the first memory cells fails, the second writing circuit is arranged to assign an address of the one of the first memory cells to the second memory cell. The first memory cells and the second memory cell are arranged to irreversibly change their electrical resistance when the data is stored in them. The first memory cells and the second memory cell include an organic compound layer interposed between a pair of electrodes.

8 Claims, 14 Drawing Sheets

U.S. PATENT DOCUMENTS

| | | | | |
|---|---|---|---|---|
| 7,605,410 | B2 * | 10/2009 | Takano et al. | 257/213 |
| 2002/0064073 | A1 * | 5/2002 | Chien | 365/200 |
| 2003/0026142 | A1 | 2/2003 | Yamada | |
| 2004/0165456 | A1 | 8/2004 | Yamada | |
| 2005/0006640 | A1 * | 1/2005 | Jackson et al. | 257/40 |
| 2005/0141264 | A1 | 6/2005 | Mutaguchi | |

FOREIGN PATENT DOCUMENTS

| | | |
|---|---|---|
| JP | 04-028249 | 1/1992 |
| JP | 04-373147 | 12/1992 |
| JP | 09-128991 | 5/1997 |
| JP | 09-504657 | 5/1997 |
| JP | 2003-036684 | 2/2003 |
| JP | 2003-051199 | 2/2003 |
| WO | WO 96/07300 A2 | 3/1996 |
| WO | WO 2005/119779 A1 | 12/2005 |

OTHER PUBLICATIONS

International Search Report (Application No. PCT/JP2005/010308) dated Sep. 13, 2005.

International Written Opinion (Application No. PCT/JP2005/010308) dated Sep. 13, 2005.

* cited by examiner

# WRITE-ONCE NONVOLATILE MEMORY WITH REDUNDANCY CAPABILITY

BACKGROUND OF THE INVENTION

1. Field of the Invention

The present invention relates to a semiconductor memory. In particular, the present invention relates to a nonvolatile memory having a plurality of memory cells that can be written once (also referred to as a nonvolatile semiconductor memory).

2. Description of the Related Art

As a semiconductor memory, there are a DRAM (Dynamic Random Access Memory), a SRAM (Static Random Access Memory), a flash memory, an EEPROM (Electrically Erasable Programmable Read Only Memory), and the like. As these memories have large capacities, there is high probability that a defective bit exists even in an advanced manufacturing process. As for a conventional large capacity memory, a redundant circuit is provided and a defective bit is modified after manufacturing a chip; therefore, a yield may be improved and the cost may be reduced. Specifically, a memory is inspected before the shipment. When there is a defective bit, such setting that an fuse within a redundant circuit is disconnected is configured for a memory having the defective bit, and the memory is shipped after restoring the defective bit (for example, see Reference 1: Keeth Baker, "DRAM: Circuit Design A TUTORIAL", IEEE PRESS, 2001, P.108-109).

SUMMARY OF THE INVENTION

As one kind of semiconductor memory, there is a nonvolatile memory having a plurality of memory cells that can be written only once, which is referred to as a write-once memory, a one time programmable memory, or the like. The write-once memory can be written only once to each memory cell; therefore, a defective bit cannot be detected by an actual inspection of writing. In other words, there is a problem that a non-defective memory and a defective memory cannot be distinguished until the memories are used. Accordingly, as described above, the measures, in which a redundant circuit is provided and the defective bit is modified before shipping, cannot be taken; thus, it is difficult to provide a memory with few defects.

In view of the above problem, it is an object of the present invention to provide a write-once memory where the probability of a defect is reduced considerably.

As described above, since the defective bit of the write-once memory cannot be inspected before shipping, it is required to reduce the probability of the defective bit considerably. Thus, the inventor has considered including a series of operations of detecting the defective bit and modifying the defective bit as the writing operation of the write-once memory, in addition to the operation of writing data, so that the probability that the defective bit is generated is reduced.

Hereinafter, a specific structure of the present invention will be described.

According to one mode of a nonvolatile memory of the present invention, the nonvolatile memory includes a memory cell array having a plurality of memory cells including a redundant memory cell; a first circuit which allocates an address to the redundant memory cell; a second circuit which outputs a determination signal that expresses whether writing is performed normally or not; and a third circuit, to which the determination signal is input, which controls the first circuit and the second circuit.

According to another mode of a nonvolatile memory of the present invention, the nonvolatile memory includes a data register; a first writing circuit; a reading circuit; a bit-line driver circuit; a word line driver circuit; a memory cell array having a plurality of memory cells including a redundant memory cell; a verifying circuit; a second writing circuit which allocates an address to the redundant memory cell; and a timing control circuit. The verifying circuit outputs a determination signal by comparing data stored in the data register and data stored in the memory cell. The timing control circuit, to which the determination signal is input, outputs at least a first control signal, a second control signal, a third control signal, and a fourth control signal. The first control signal is input to the verifying circuit. The second control signal is input to the second writing circuit. The third control signal is input to the first writing circuit. The fourth control signal is input to the reading circuit.

According to the nonvolatile memory of the present invention, each of the plurality of memory cells may have a memory element and the memory element may have an organic layer.

According to another mode of the present invention, a semiconductor device having a communication function, where the nonvolatile memory is incorporated, is provided.

According to another mode of the present invention, a semiconductor device having a communication function formed over a flexible substrate, where the nonvolatile memory is incorporated, is provided.

According to another mode of the present invention, the following where the semiconductor device is mounted is provided: paper money, a coin, securities, a certificate, a bearer bond, a packaging container, a book, recording media, a vehicle, food, clothing, a health product, a commodity, a chemical, or an electronic device.

According to one mode of a method for writing a nonvolatile memory, the method includes the steps of a first step of writing first data to a first address; a second step of comparing second data stored in the first address after the first step with the first data; a third step of allocating the first address to a redundant memory cell in a case where the result of the second step discords; and a fourth step of writing the first data to the redundant memory cell after the third step.

According to the structure and the writing method of the present invention, a write-once memory with few defects is provided.

In addition, a semiconductor device, which is formed over a flexible substrate, has a communication function, where a nonvolatile memory of the present invention is incorporated. Without data rewritten, the semiconductor device can realize a high level of security with few defects.

DETAILED DESCRIPTION OF THE INVENTION

Figure 1:
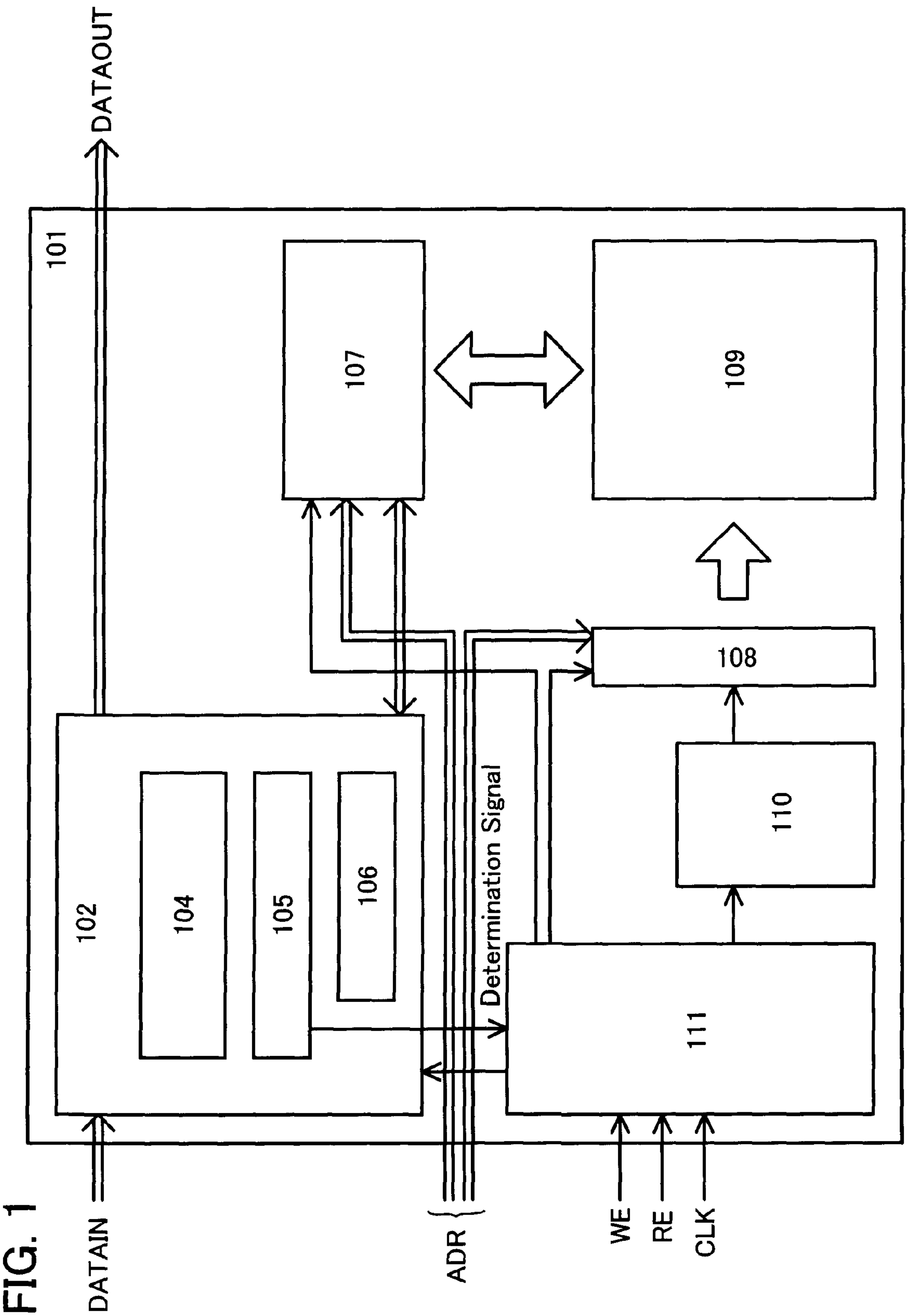
FIG. 1 is a block diagram of a semiconductor memory of the present invention.

Embodiment modes of the present invention will be explained hereinafter with reference to the accompanying drawings. However, it is to be easily understood that various changes and modifications will be apparent to those skilled in the art. Therefore, unless such changes and modifications depart from the purpose and the scope of the present invention, they should be construed as being included therein. Note that the same portions or portions having the same function in all figures for explaining embodiment modes are denoted by the same reference numerals and detailed explanations thereof will be omitted.

Embodiment Mode 1

This embodiment mode will explain the structure and operation of a write-once memory of the present invention.

First, an example of the structure and operation of a write-once memory, where the operation of standard writing is performed, will be explained. Here, a memory element, the initial state of which is in high resistance, can be written when a voltage of 6V is applied. The memory element is to have a characteristic to be in a low-resistant state after written. As the memory element, a structure where an inorganic film or an organic film is provided between electrodes can be employed.

Figure 10A:
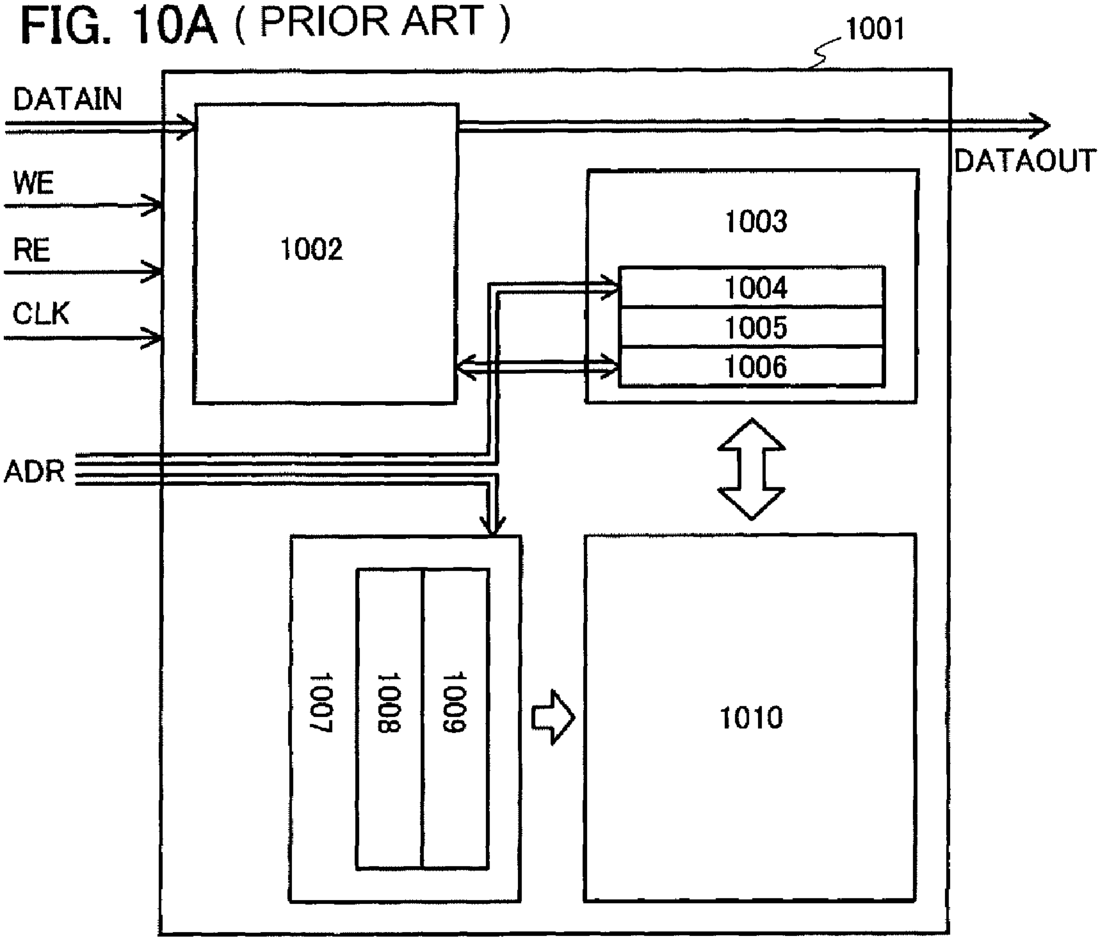
FIGS. 10A and 10B are each a block diagram of a semiconductor memory.
Figure 10B:
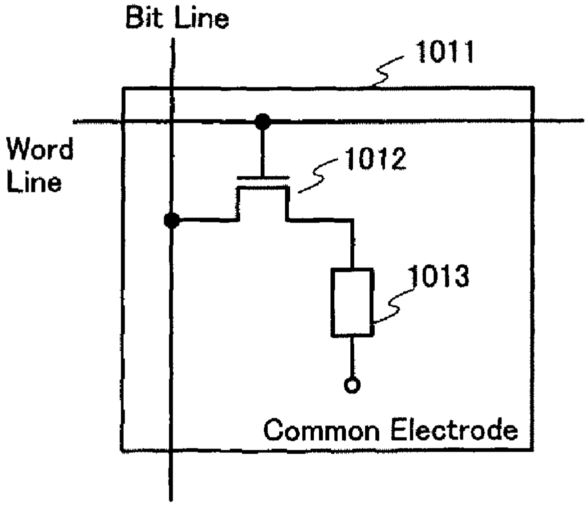

FIG. 10A is an example of a block diagram of a write-once memory, where a memory 1001 has a reading/writing circuit 1002, a bit line driver circuit 1003, a word line driver circuit 1007, and a memory cell array 1010. The bit line driver circuit 1003 has a column decoder 1004, a level shifter 1005, and a selector 1006. The word line driver circuit 1007 has a row decoder 1008 and a level shifter 1009. FIG. 10B is a circuit diagram of a memory cell included in the memory cell array 1010. A memory cell 1011 includes a select transistor 1012 and a memory element 1013. One of a source electrode and a drain electrode of the select transistor is connected to a bit line, the other electrode is connected to one electrode of the memory element 1013, and a gate electrode of the select transistor is connected to a word line, respectively. In addition, the other electrode of the memory element 1013 is connected to a common electrode (potential Vc).

A write enable signal (WE), a read enable signal (RE), a clock signal (CLK), an address signal (ADR), and an input data signal (DATAIN) are input to the write-once memory shown in FIGS. 10A and 10B, and an output data signal (DATAOUT) is output. When the write enable signal (WE) is asserted, a memory cell specified by the address signal is selected; therefore, the input data is written to the selected memory cell. In addition, when the read enable signal (RE) is asserted, a memory cell specified by the address signal is selected; therefore, the data stored in the selected memory cell is read as the output data signal (DATAOUT). Since the memory of the present invention is the write-once memory, it should not be possible to assert the write enable signal and to input the input data signal before shipping, in order to inspect and modify the defective bit. Accordingly, in the write-once memory of the present invention, the user of the memory may assert the write enable signal. Further, the input data signal may not be the data signal for inspecting the defective bit.

The address signal is input to the column decoder 1004, and a signal line of a specified column is selected. The level shifter 1005 changes the voltage level of the signal line, if necessary. The selector 1006 drives the switch of the column selected by the column decoder 1004, and connects the bit line and reading/writing circuit 1002. The address signal is input to the row decoder 1008, and a signal line of a specified row is selected. The level shifter 1009 changes the voltage of the signal line, if necessary. Consequently, predetermined potential is input to the selected word line.

For example, at the time of writing, the selected memory cell has the bit line and the word line each given with a voltage of 6V, and the common electrode given with a voltage of 0V. Consequently, the select transistor 1012 is turned on, and a voltage of approximately 6V is applied to the memory element 1013; therefore, element characteristics (resistance or the like) of the memory element 1013 is changed. In addition, at the time of reading, the selected memory cell has the word line and the common electrode given with voltages of 3V and 0V, respectively; therefore, the select transistor 1012 is turned on. Accordingly, the selected bit line is connected to the reading circuit. Consequently, the stored data is read in accordance with element characteristics (a high-resistant state, a low-resistant state, or the like) of the memory element 1013.

As described through the above, a write-once memory, where the operation of standard writing is performed, is formed, and the operation of writing or reading is performed.

Next, an example of the structure and operation of the write-once memory of the present invention will be explained. FIG. 1 is an example of a block diagram of the write-once memory of the present invention, where a memory 101 has a reading/writing/verifying circuit 102, a bit line driver circuit 107, a word line driver circuit 108, a memory cell array 109, a second writing circuit 110, and a timing control circuit 111. The reading/writing/verifying circuit 102 has a reading/writing circuit 104, a verifying circuit 105, and a data register 106. A writing circuit in the reading/writing circuit 104 is also referred to as a first writing circuit.

As compared with a write-once memory of general, the write-once memory of the present invention includes, as its structure, the memory cell array 109 having a redundant memory cell and a driver circuit of the memory cell array 109 corresponding to the redundant memory cell. In addition, the write-once memory of the present invention also includes the verifying circuit 105 that confirms the result of the writing; the second writing circuit 110 that allocates the address to the redundant memory cell; and the timing control circuit 111 that controls the reading/writing/verifying circuit 102, the second writing circuit 110, the bit line driver circuit 107, and the word line driver circuit 108. Moreover, a determination signal output from the verifying circuit 105 is input to the timing control circuit 111.

A write enable signal (WE), a read enable signal (RE), a clock signal (CLK), an address signal (ADR), and an input data signal (DATAIN) are input to the memory 101, and an output data signal (DATAOUT) is output. The reading operation is performed by asserting the read enable signal (RE). When the read enable signal (RE) is asserted, a memory cell specified by the address signal is selected; therefore, the data stored in the selected memory cell is read as the output data signal (DATAOUT).

Figure 2:
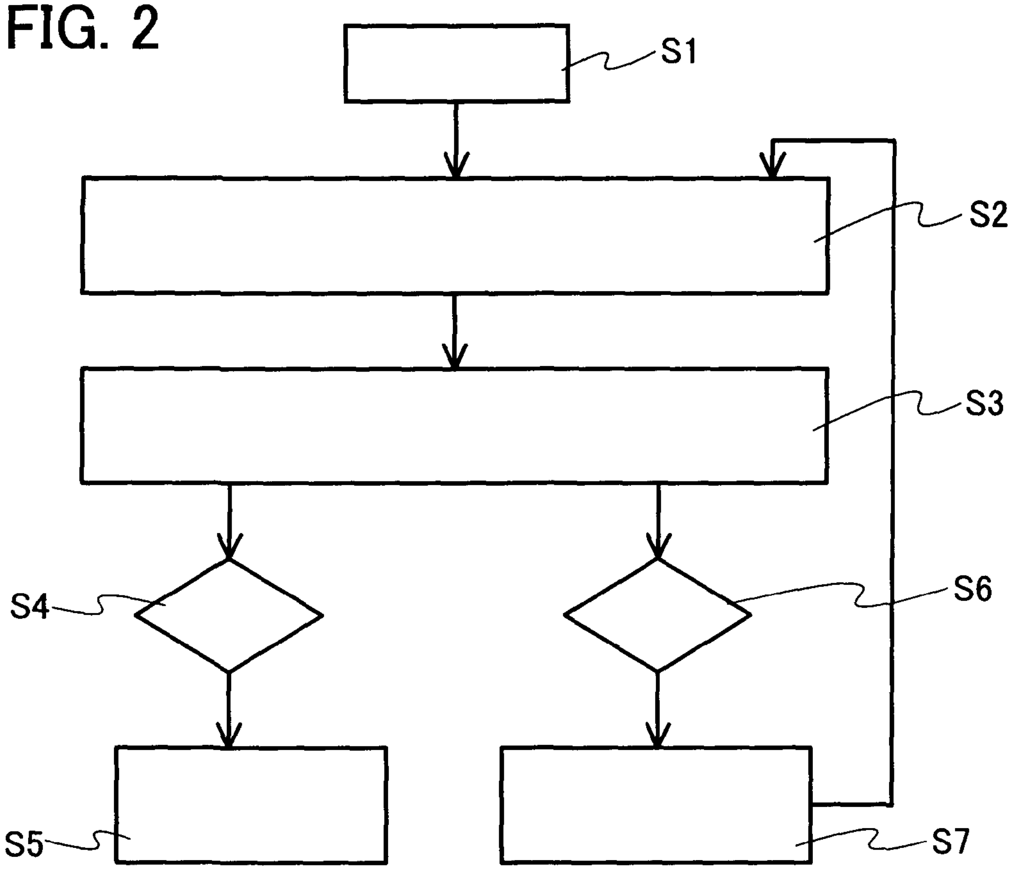
FIG. 2 is a flow chart expressing the writing operation of a semiconductor memory of the present invention.

FIG. 2 shows a flow chart showing an example of a series of writing operations. The writing operation is performed when a write enable signal (WE) is asserted (S1). When the write enable signal is asserted (S1), first, a memory cell specified by the address signal (ADR) is selected; therefore, the input data is written to the selected memory cell (S2). Then, after the input data is written, the result of the writing is confirmed by comparing the data stored in the selected memory cell with the input data (S3). When both the data accord (S4), it is determined that the writing operation is performed normally; therefore, the writing operation is completed (S5). When both the data discord (S6), it is determined that abnormality is caused in the writing; therefore, the address where abnormality is caused is allocated to the redundant memory cell (S7). Then, the writing operation is completed by performing writing again.

Note that, when the writing is determined as abnormal writing, the number of times that the address where abnormality is caused can be allocated to the redundant memory cell depends on the structure of the redundant memory cell, the word line driver circuit 108, or the bit line driver circuit 107. When the address can be allocated more than once, the result of the writing may be repeatedly confirmed equivalently to the number of times. When a writing defect is caused beyond the number of times that the address can be allocated to the redundant memory cell, this causes defective writing. In addition, before completing a series of writing operations, the result of the writing may be confirmed, so that the determination signal that notify whether the writing operation is normally completed or the defect is caused is output.

By having such a structure and performing such a writing operation, the write-once memory of the present invention is capable of considerably reducing the probability of being defective. For example, given a manufacturing process having a 1-bit defect per 1 G bit, a conventional 1 M-bit write-once memory becomes defective even in a case of a 1-bit defect; therefore, approximately one defect is caused among 1,000 write-once memories. On the other hand, when a 1 M-bit write-once memory having the structure of the present invention can modify, for example, the arbitrary 1-bit defect, the write-once memory becomes defective only when a defective bit of 2 bits or more is caused; therefore, the defects are reduced to approximately one defect among 1,000,000 write-once memories.

Then, the operation of each block operation shown in FIG. 1 will be explained. The operation conditions of the reading/writing circuit 104, the memory cell of the memory cell array 109, and the memory element of the memory cell may be the same as those of the write-once memory explained with reference to FIGS. 10A and 10B. Note that the data register 106 is a register where reading data, writing data, or comparison data is stored.

The memory cell array 109 includes, as its structure, the redundant memory cell, and the bit line driver circuit 107 and the word line driver circuit 108 each corresponding to the redundant memory cell. For example, a structure where one word line and one row of the memory cell are added can be considered. The word line driver circuit 108 has a nonvolatile memory element that stores setting of allocation of the address to the redundant memory cell. The second writing circuit 110 is a circuit that performs writing to the memory element. For example, when abnormal writing is caused with the input address, writing is performed in the second writing circuit 110; therefore, the address is allocated to the redundant memory cell.

The verifying circuit 105 is a circuit that compares data that perform writing with data after writing and outputs a determination signal. For example, the two pieces of data are compared by performing exclusive-OR, thereby generating a determination signal by obtaining OR of all comparative results. In this case, the determination signal expresses accordance with a logical value of "0" and discordance with a logical value of "1", thereby outputting a logic value of "0" at the time of normal writing and a logic value of "1" at the time of abnormal writing, respectively.

The timing control circuit 111 is a circuit that controls the timing of a series of writing operations of the present invention. The timing control circuit 111, to which the WE signal, the RE signal, the CLK signal, and the determination signal are input, generates and outputs a signal that controls the reading/writing circuit 104, a signal that controls the verifying circuit 105, and a signal that controls the second writing circuit 110, respectively.

The signal that controls the reading/writing circuit 104 at least has a fourth control signal that controls reading and a third control signal that controls writing, which are input to the reading/writing circuit 104. The signal that controls the verifying circuit 105 (also referred to as a first control signal) is input to the verifying circuit 105. The signal that controls the second writing circuit 110 (also referred to as a second control signal) is input to the second writing circuit 110.

When the RE signal is asserted, the bit line driver circuit 107, the word line driver circuit 108, and a reading circuit in the reading/writing circuit 104 are enabled, so that a normal reading operation is controlled. In addition, when the WE signal is asserted, for example, a series of writing operations as will be described below is controlled.

When the WE signal is asserted, the bit line driver circuit 107, the word line driver circuit 108, and the writing circuit are enabled, and the writing of the input data is performed. Next, the result of the writing is confirmed by enabling the verifying circuit 105. Then, the following process will be performed based on the determination signal which is output from the verifying circuit 105.

Figure 4A:
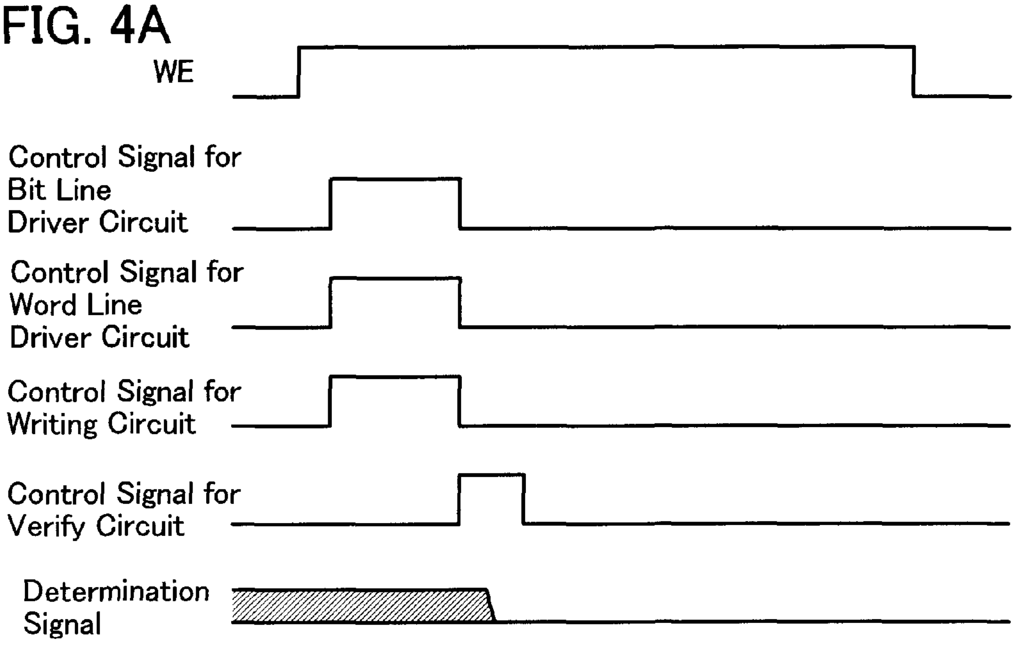
FIGS. 4A and 4B are timing charts each expressing the writing operation of a semiconductor memory of the present invention.
Figure 4B:
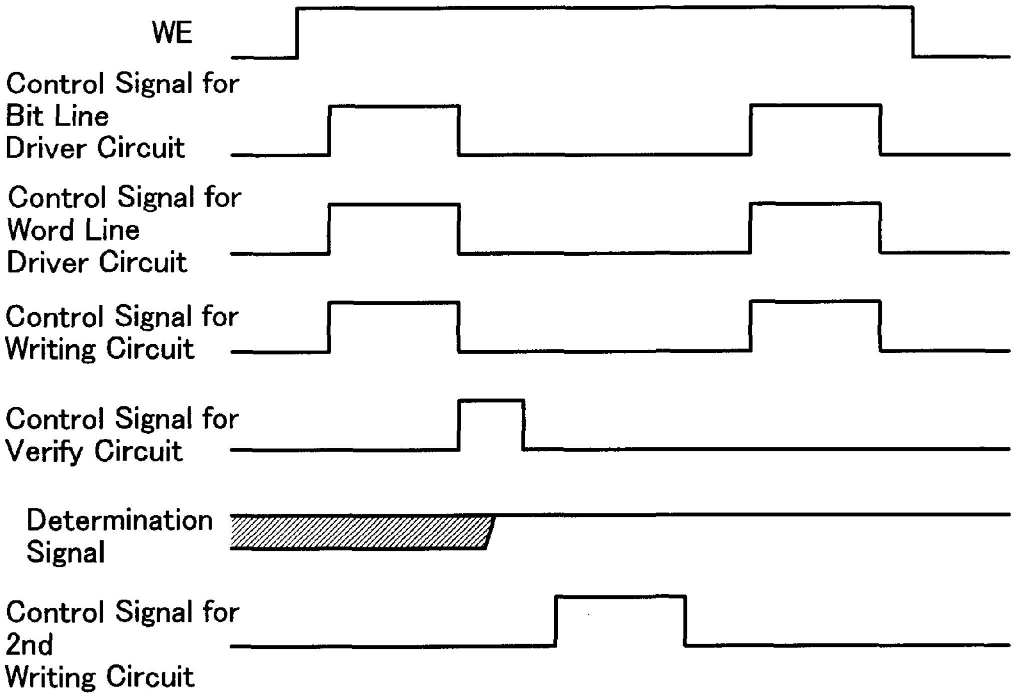

When the determination signal indicates normal writing, the writing operation is completed. When the determination signal indicates abnormal writing, the timing control circuit 111 makes the second writing circuit 110 enable, so that the input address is allocated to the redundant memory cell. Next, the bit line driver circuit 107, the word line driver circuit 108, and the writing circuit in the reading/writing circuit 104 (the first writing circuit) are enabled, so that the writing operation is completed after writing the input data to a memory cell which is newly allocated. FIGS. 4A and 4B each show a timing chart at the time of the writing that is controlled by the timing control circuit 111. FIG. 4A shows a timing chart at the time of normal writing, and FIG. 4B shows a timing chart at the time of abnormal writing.

Note that the process in the case where the determination signal indicates abnormal writing is slightly different depending on the structure of the redundant memory cell. The above process is performed in the case of the structure where the redundant memory cell is allocated only to the address where writing is performed. On the other hand, a case, where the redundant memory is allocated to one row including the address where writing is performed, is as follows.

When the determination signal indicates abnormal writing, the timing control circuit 111 makes the bit line driver circuit 107, the word line driver circuit 108, and the reading circuit of the reading/writing circuit 104 enable, so that reading of the data of a row where abnormal writing is caused is performed. At this time, based on the data of a row where abnormal writing is caused and the input data, the reading/writing circuit forms the data of one row of a case, where normal writing is performed, which is stored in the data register 106. Next, the second writing circuit 110 is enabled, and the input address is allocated to the redundant memory cell. Then, the bit line driver circuit 107, the word line driver circuit 108, and the writing circuit in the reading/writing circuit 104 are enabled, so that the writing operation is completed after writing the data of one row which is stored in the data register 106 to a memory cell which is newly allocated.

As described through the above, the timing control circuit 111 controls the timing of the reading operation or a series of the writing operations.

Next, an example of the word line driver circuit 108 corresponding to the redundant memory cell will be explained with reference to FIG. 3. A word line driver circuit 301 shown in FIG. 3 includes a row decoder 303, a level shifter 304, a redundant row decoder 305, an active bit 306, and other logic gates, and a row address signal, a column address signal, and an enable signal are input to the word line driver circuit 301. The enable signal and the row address signal are input to the row decoder 303. When the enable signal is asserted, a word line specified by the row address is selected, and other word line is not selected. The redundant row decoder 305 has an address register 307 where the address of the redundant memory cell is stored, and the enable signal and the address signal are input thereto. Then, when the enable signal is asserted and the input address accords with the address stored in the address register, the word line connected to the redundant memory cell is selected. In other cases, the word line connected to the redundant memory cell is not selected. The address register 307 and the active bit 306 are each formed by a nonvolatile memory, and a 1-bit memory element can be used as well as the memory element included in the memory cell. In a second writing circuit 302, a control signal from the timing control circuit 111 is input and written to the address register 307 and the active bit 306 of the word line driver circuit 301.

Then, the operation of the word line driver circuit 301 shown in FIG. 3 will be explained. The initial values of the address register 307 and the active bit 306 are each assumed as a logic value of “1”, and the enable signal is assumed to be asserted at a logic value of “1”. In addition, among the output signals of the row decoder 303, logic values of “1” and “0” are assumed to be output to the signal line that is selected and the signal line that is not selected, respectively.

When the output signal of the redundant row decoder 305 is a logic value of “0” (not selected), the enable signal input to the word line driver circuit 301 and the enable signal input to the row decoder 303 are accorded with each other, so that the word line driver circuit 301 serves as a word line driver circuit having no redundant configuration. Therefore, when the enable signal input to the word line driver circuit 301 is asserted, the row decoder 303 selects the word line specified by the row address. On the other hand, when the output signal of the redundant row decoder 305 is a logic value of “1” (selected), the enable signal input to the row decoder 303 is not asserted; thus, only the word line connected to the redundant memory cell is selected.

The enable signal of the redundant row decoder 305 is not asserted because the active bit 306 is a logic value of “1” at the initial state, so that the word line driver circuit 301 serves as a word line driver circuit having no redundant configuration. In other words, when the enable signal is asserted, the row decoder 303 selects the word line specified by the row address.

Then, it is assumed that a logic value of “0” and an address to be allocated to the redundant memory cell are written to the active bit 306 and the address register 307, respectively, by the second writing circuit 302. In this case, when the enable signal input to the word line driver circuit 301 is asserted, the enable signal input to the redundant row decoder 305 is also asserted. Accordingly, the input address and the address stored in the address register 307 are compared. When both the addresses accord, only the word line connected to the redundant memory cell is selected. When both the addresses disaccord, the word line connected to the redundant memory cell is not selected but the output signal of the redundant row decoder 305 is a logic value of “0”, so that the redundant row decoder 305 serves as a word line driver circuit having no redundant configuration. Consequently, the row decoder 303 selects the word line specified by the row address.

Figure 3:
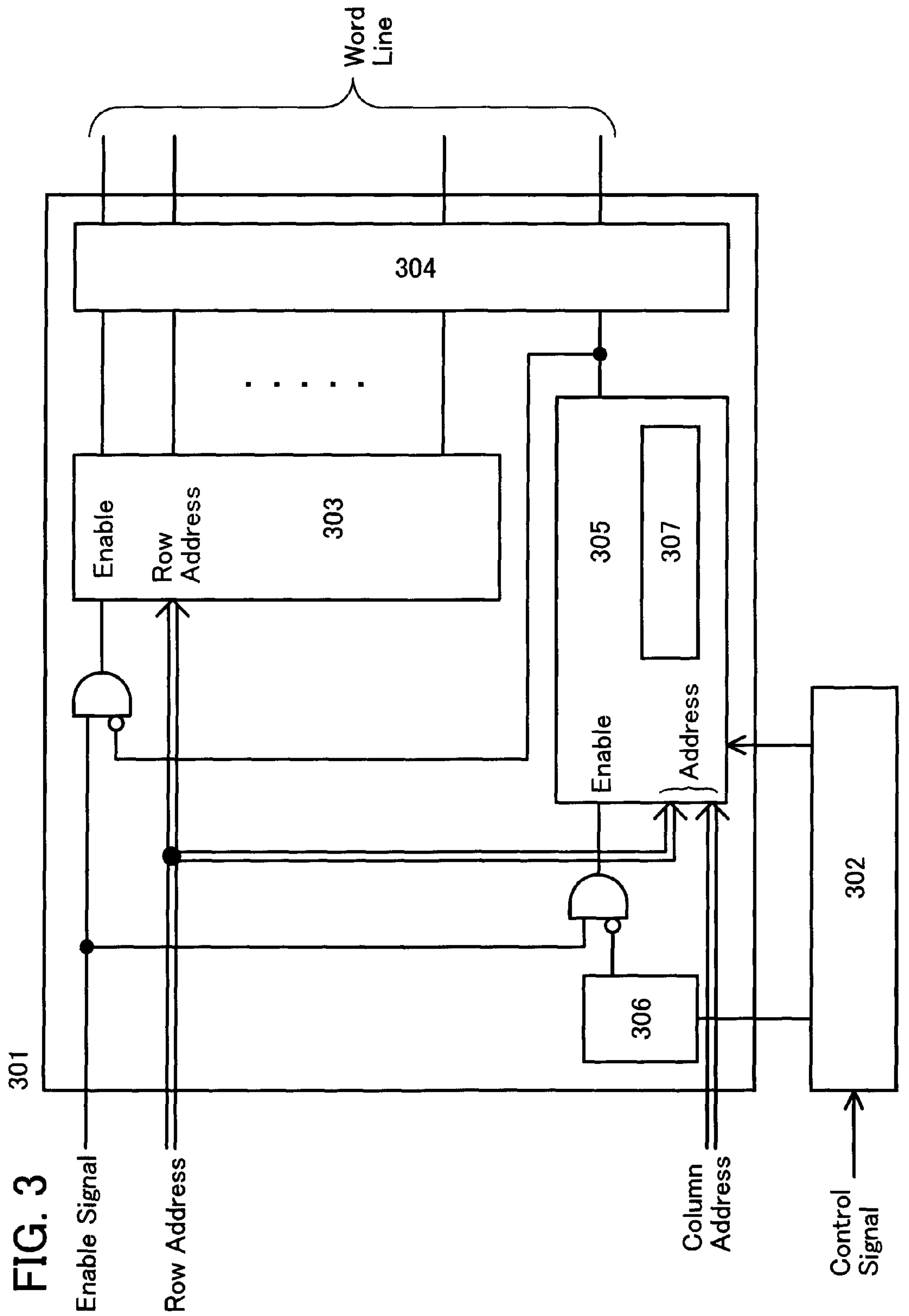
FIG. 3 is a diagram explaining the configuration of a word line driver circuit included in a semiconductor memory of the present invention.

The examples shown in FIG. 3 has the structure where only the address, where abnormal writing is performed, is allocated to the redundant memory cell by the row address and the column address stored in the address register 307. It is also possible to have a structure where only the row address is stored in the address register 307. In this case, the structure where, the entire row specified by the row address where abnormal writing is caused is allocated to the redundant memory cell, is obtained.

Note that the case of adding a memory corresponding to one row of the word line as the redundant memory cell is described; however, a plurality of rows can also be added. In addition, one or a plurality of bit lines can also be added.

Figure 5:
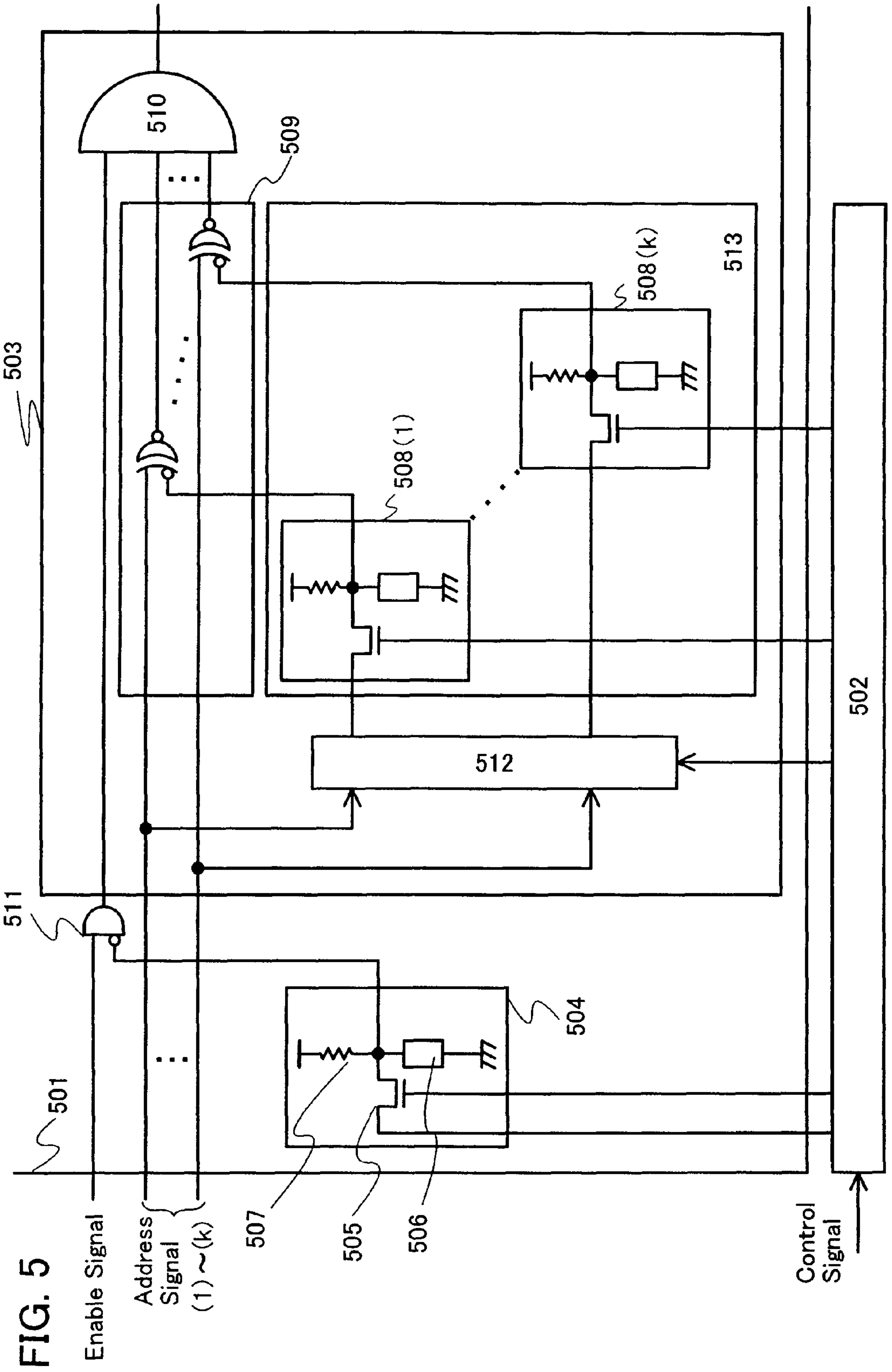
FIG. 5 is a diagram explaining the configuration of a word line driver circuit included in a semiconductor memory of the present invention.

Next, an example of a detailed circuit configuration of the word line driver circuit 301 shown in FIG. 3 will be explained. FIG. 5 shows part of a word line driver circuit 501 and a second writing circuit 502. In FIG. 5, the word line driver circuit 501 includes an active bit 504, a redundant row decoder 503, and a logic gate 511, to which an enable signal and a k (k is a natural number)-bit address signal are input. The k-bit address signal may include a row address and a column address, or only a row address.

The active bit 504 has a select transistor 505, a memory element 506, and a pull-up resistor 507. The memory element 506, the initial state of which is in high resistance, outputs a logic value of “1”. At the time of writing, for example, a signal of 6V is input from the second writing circuit 502, and the memory element 506 is changed into a low-resistant state. Consequently, the resistant value of the memory element 506 gets smaller enough than that of the pull-up resistor 507, and the active bit 504 outputs a logic value of “0”.

The redundant row decoder 503 includes an address register 513, a comparator 509, a logic gate 510, and a level shifter 512. The address register 513 includes k-bit memory cells 508(1), and 508(2) to 508(*k*), each of which has a select transistor, a memory element, and a pull-up resistor. At the time of writing, the input k-bit address is written by inputting, for example, a signal of 6V from the second writing circuit 502. The comparator 509 compares an address signal and an address stored in the address register 513. The logic gate 510 performs a logic operation of an enable signal input to the redundant row decoder 503 and the output signal of the comparator 509. Consequently, a redundant word line is selected only when the enable signal is asserted and the input address accord with the address stored in the address register 513.

By having such a structure and performing such a writing operation, the write-once memory of the present invention is capable of considerably reducing the probability of being defective.

Note that this embodiment mode explains the case where the memory element is in high resistance at the initial state and in low resistance after the writing; however, the element characteristics of the memory element is not limited thereto. The memory element may have characteristics that the initial state is in low resistance, which is changed into high resistance with a voltage applied. In addition, other than the element, the characteristics of which are changed due to the application of a voltage, an element, the characteristics of which are changed with a current applied, may also be used.

Note that, in the structure shown in this embodiment mode, the bit width for performing writing or reading is not particularly specified. Serial writing and serial reading per 1 bit, synchronizing writing and synchronizing reading of a plurality of bits, one-line row simultaneous reading and one-line row simultaneous writing, or one-line row simultaneous reading and serial writing may be combined.

Embodiment 1

Figure 6:
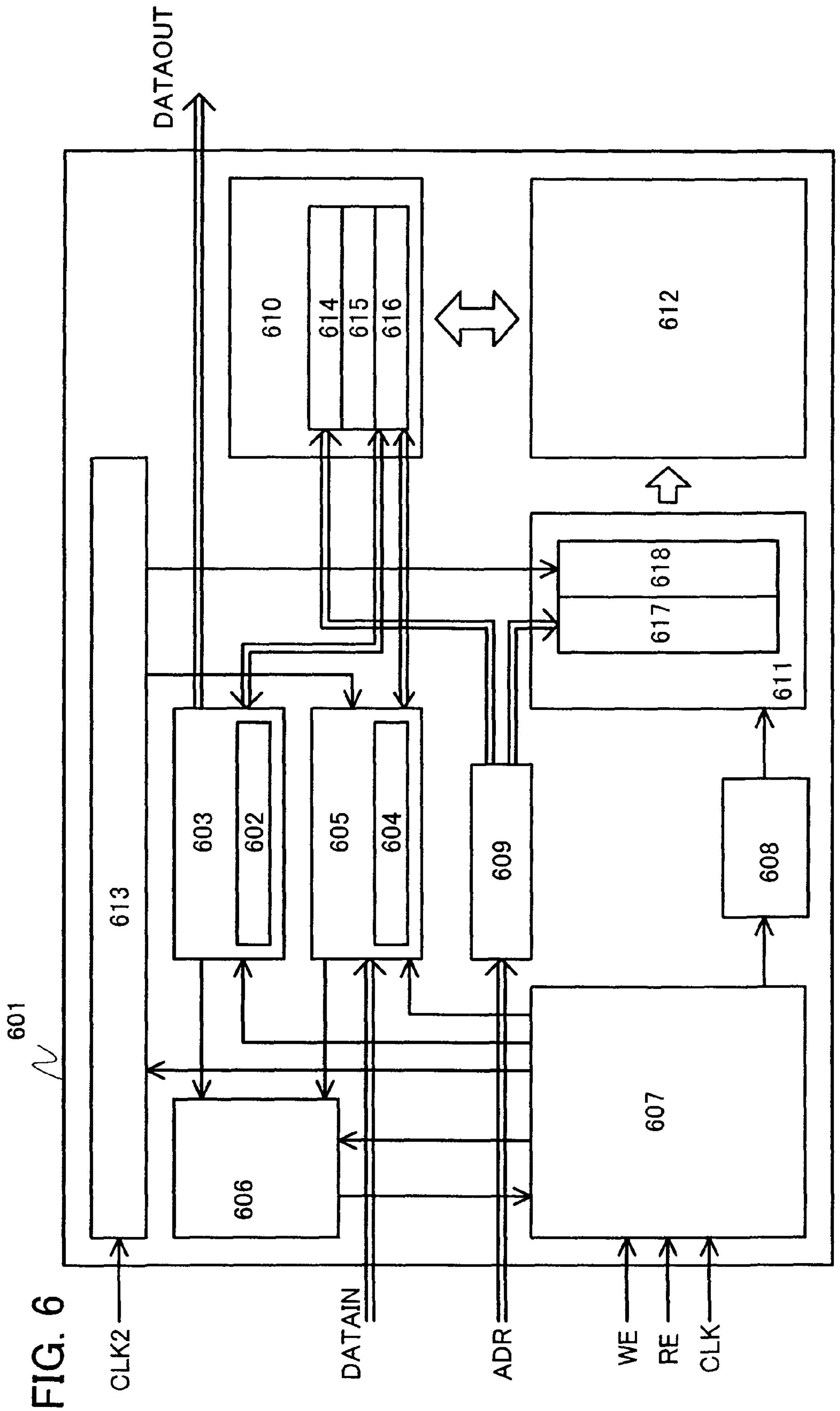
FIG. 6 is a block diagram of a semiconductor memory of the present invention.

The structure and operation of a write-once memory of the present invention will be explained by giving an example different from FIG. 1. FIG. 6 is a block diagram of the write-once memory of the present invention, where a memory 601 includes a reading circuit 603 having a data register 602, a reading circuit 605 having a data register 604 (also referred to as a first writing circuit), a verifying circuit 606, a timing control circuit 607, a second writing circuit 608, an address register 609, a bit line driver circuit 610, a word line driver circuit 611, a memory cell array 612, and a boosting circuit 613. In addition, a write enable signal (WE), a read enable signal (RE), a clock signal (CLK), an address signal (ADR), an input data signal (DATAIN), and a second clock signal (CLK2) are input to the memory 601, and an output data signal (DATAOUT) is output.

As compared with the block diagram shown in FIG. 1, FIG. 6 includes the boosting circuit 613 and the address register 609 and shows an example of a diagram of a reading/writing/verifying circuit (corresponding to the reading circuit 603, the writing circuit 605, and the verifying circuit 606 in FIG. 6), the bit line driver circuit 610, and the word line driver circuit 611.

The reading circuit 603 and the writing circuit 605 each have a data register. The data read by the reading circuit 603 is stored in the data register 602, and the input data written by the writing circuit 605 is stored in the data register 604. The verifying circuit 606 refers to the data of the reading circuit 603 that is stored in the data register 602 and the data of the writing circuit 605 that is stored in the data register 604, and the two pieces of data are compared.

The bit line driver circuit 610 includes a column decoder 614, a level shifter 615, and a selector 616. A column address is input to the column decoder 614 from the address register 609, and decoding is performed. In the level shifter 615, the level of the output potential of the column decoder 614 is shifted. For example, at the time of writing, the output of the column decoder, the voltage of which is 0 to 3V, is converted to a high voltage of 0 to 6V The selector 616 performs switching in accordance with the output of the level shifter 615, and the bit line specified by the column address is connected to the reading circuit 603 or the writing circuit 605. The word line driver circuit 611 includes a row decoder 617 and a level shifter 618. In the row decoder 617, to which the column address signal is input from the address register, decoding is performed. In the level shifter 618, the level of the output potential of the row decoder is shifted, so that the word line is driven.

In the boosting circuit 613, to which the second clock signal and a control signal from the timing control circuit 607 are input, a high power supply voltage which is necessary at the time of writing is generated, and the high power supply voltage is provided to the level shifter 615, the level shifter 618, and the writing circuit 605.

The timing control circuit 607 controls the timing of the reading circuit 603, the writing circuit 605, the verifying circuit 606, the second writing circuit 608, the bit line driver circuit 610, the word line driver circuit 611, and the boosting circuit 613. In addition, a determination signal output from the verifying circuit 606 is input to the timing control circuit 607.

Other structures and operations are the same as those of FIG. 1. The memory cell array 612 includes a redundant memory cell and a driver circuit having a structure corresponding to the redundant memory cell. When the read enable signal (RE) is asserted, the memory cell specified by the address signal is selected; therefore, the data stored in the selected memory cell is read as the output data signal (DATAOUT). In addition, when the write enable signal is asserted, the memory cell specified by the address signal is selected; therefore, the input data is written to the selected memory cell. Then, after the input data is written, the written data and the input data are compared. When the two pieces of data discord, the address input to the redundant memory cell is allocated, so that the writing is performed again.

By having such a structure and performing such a writing operation, the write-once memory of the present invention is capable of considerably reducing the probability of being defective.

Note that, in the structure shown in this embodiment, the bit width for performing writing or reading is not particularly specified. Serial writing and serial reading per 1 bit, synchronizing writing and synchronizing reading of a plurality of bits, one-line row simultaneous reading and one-line row simultaneous writing, or one-line row simultaneous reading and serial writing may be combined. This embodiment can be implemented by being arbitrarily combined with Embodiment Mode described above.

Embodiment 2

An example of a circuit configuration, which differs from that of FIG. 3, of a word line driver circuit and a second writing circuit will be explained.

Figure 7:
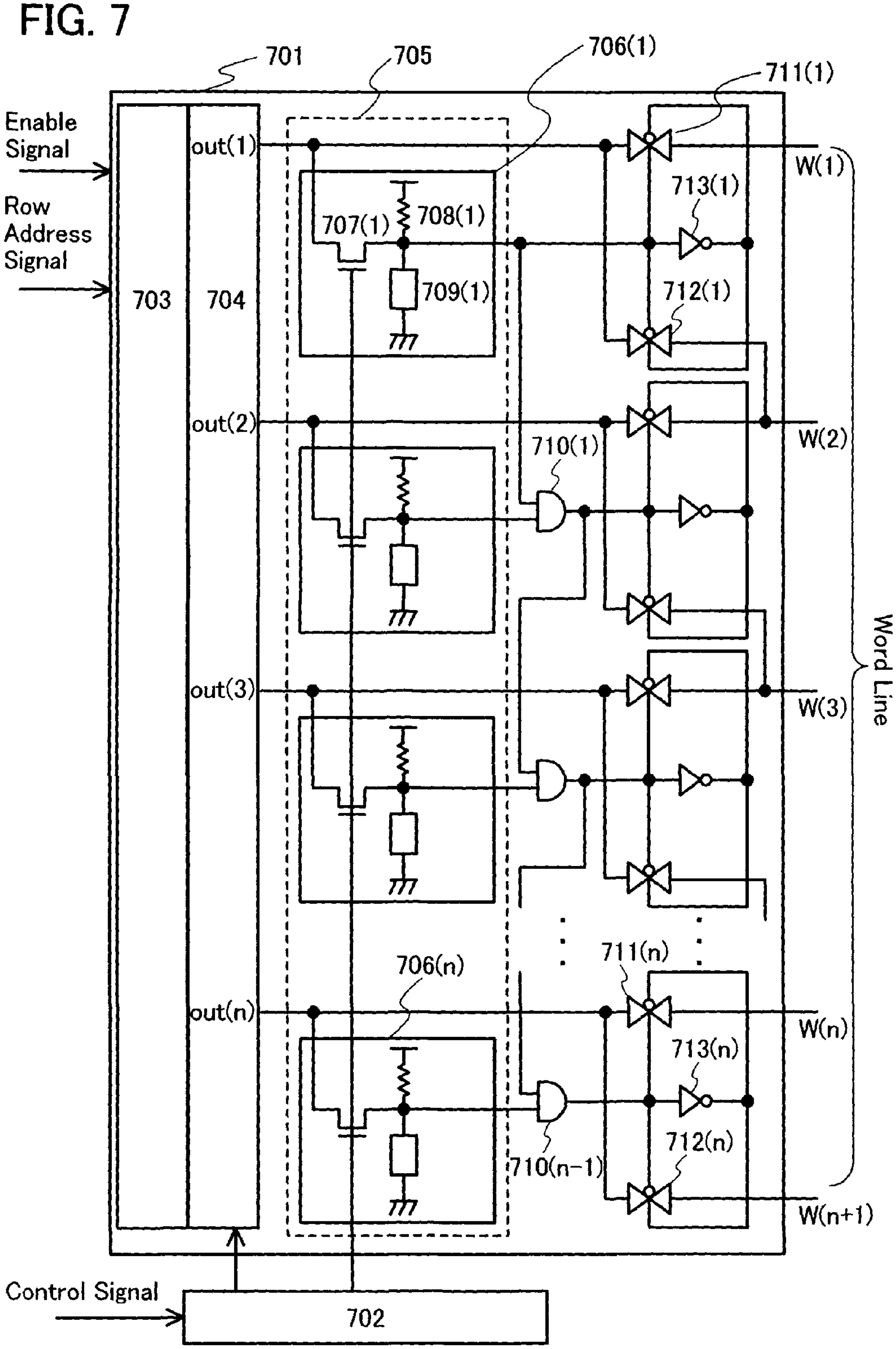
FIG. 7 is a diagram explaining the configuration of a word line driver circuit included in a semiconductor memory of the present invention.

FIG. 7 shows a word line driver circuit 701 and a second writing circuit 702. The word line driver circuit 701 includes in its structure a row decoder 703, a level shifter 704, a set bit 705, logic gates 710(1) to 710(n−1), transmission gates 711 (1) to 711(*n*) and 712(1) to 712(*n*), and inverters 713(1) to 713(*n*). A row address and an enable signal are input to the word line driver circuit 701, and word lines W1 to W(n+1) are output. The number of output signals of the row decoder 703 is n, whereas the number of word lines is (n+1) including one word line connected to the redundant memory cell.

The set bit 705 is provided with a memory cell 706(*i*) (i=1 to n) for every output of the row decoder 703. The set bit 705 is a nonvolatile memory, and a memory cell the same as that of the memory cell array can be used. Each memory cell 706(*i*) includes a select transistor 707(*i*), a pull-up resistor 708(*i*), and a memory element 709(*i*) (i=1 to n). At the initial state, the memory element is in a state of high resistance, and data, the logic value of which is "1", is output. At the time of writing, the memory element of the row specified by the input address is changed to a state of low resistance by inputting, for example, a control signal of approximately 6V from the second writing circuit 702. Consequently, the resistance of the memory element gets lower than that of the pull-up resistor by enough, so that data, the logic value of which is "0", is written.

The output signal out (i) of the level shifter 704 is connected through the word line W( i) and the transmission gate 711(*i*) and through the word line W(i+1) and the transmission gate 712(*i*) (i=1 to n). The transmission gates 711(*i*) and 712(*i*) are controlled by the output signals of the set bit at 1 to i rows.

The control signal from the timing control circuit is input to the second writing circuit 702, and the second writing circuit 702 outputs the control signal to the level shifter 704 and the set bit 705.

Next, the operation of the word line driver circuit 701 will be explained. The initial value of the set bit 705 is to be a logic value of "1", and a logic value of "1" is to be output when the word line is selected and a logic value of "0" is to be output when the word line is not selected.

Since the set bit is a logic value of "1" at the initial state, all of the transmission gates 711(*i*) are turned on, and all of the transmission gates 712(*i*) are turned off. Thus, the output signal out (i) of the level shifter is connected to the word line W(i), and the word line W(i) is driven. The word line W(n+1) is not used.

Then, it is assumed that a logic value of "0" is written to the k-th row set bit only by the second writing circuit 702. In this case, the output of the memory cell 706(*k*) is a logic value of "0". As for the k-th row or thereafter, all of the transmission gates 711(*i*) (i=k to n) are turned off, and all of the transmission gates 712(*i*) (i=k to n) are turned on. On the other hand, since the set bit of the 1st to (k−1)-th rows is a logic value of "1", all of the transmission gates 711(*i*) (i=1 to (k−1)) are turned on, and all of the transmission gates 712(*i*) (i=1 to (k−1)) are turned off. Therefore, when i=1 to (k−1) is set, the output signal out (i) of the level shifter is connected to the word line W(i), and the word line W(i) is driven. On the other hand, when i=k to n is set, the output is connected to the word line W(i+1), and the word line W(i+1) is driven. The word line W(k) is not used.

In such a manner, it is found that the word line driver circuit 701 shown in FIG. 7 can modify an arbitrary row. In other words, when abnormal writing occurs at the k-th row, a logic value of "0" is written to the k-th row set bit, so that the use of the k-th row is canceled, and the row address can be allocated with all lines shifted by one.

Note that, when the redundant memory having such a structure is used for the write-once memory of the present invention, it is necessary that writing to a memory not be performed through random access but be performed sequentially.

This embodiment can be implemented by being arbitrarily combined with Embodiment Mode and Embodiment 1 described above.

Embodiment 3

An example of the structure of the verifying circuit will be explained with reference to FIG. 8.

Figure 8:
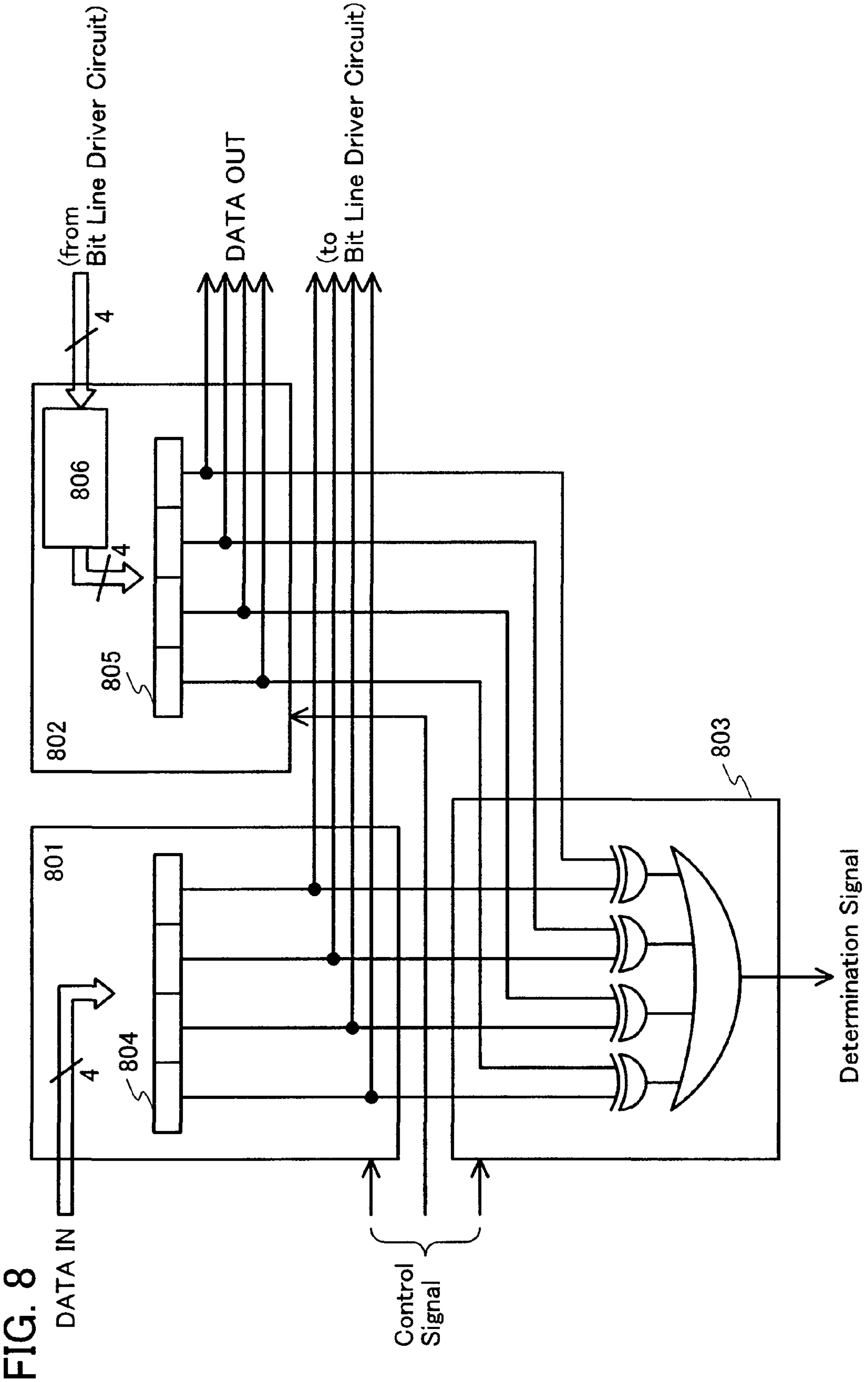
FIG. 8 is a diagram explaining the configuration of a verifying circuit included in a semiconductor memory of the present invention.

FIG. 8 shows an example of a structure of a writing circuit 801, a reading circuit 802, and a verifying circuit 803 when the data bit width is 4 bits. The writing circuit 801 includes a data register 804 where input data (DATAIN) and a control signal are input and the value of the data register 804 is output. The reading circuit 802 includes a sense amplifier 806 and a data register 805 where the data output from the bit line driver circuit and a control signal are input and the value of the data register 805 is output. The verifying circuit 803 includes an exclusive-OR gate and an OR gate where the control signal and the values of the data register 804 and the data register 805 are input so that a determination signal is output.

The verifying circuit 803 shown in FIG. 8 performs exclusive-OR operations for each bit of the data register 804 and the data register 805. Then, a determination signal is generated by performing an OR operation for each operation result. The determination signal is a logic value of "0" only when the data register 804 and the data register 805 are in complete accordance with each other, and the determination signal is a logic value of "1" when the two registers are in discordance by even 1 bit.

As shown in FIG. 8, when the verifying circuit 803 includes only combinational circuits, it is not necessary to input a control signal from the timing control circuit. On the other hand, when a latch is provided at the output of the OR gate, the value of the determination signal is updated through synchronization with the control signal. When such timing control is performed, the control signal is necessary.

Note that this embodiment can be implemented by being arbitrarily combined with Embodiment Mode and Embodiments 1 and 2 described above.

Embodiment 4

Figure 9:
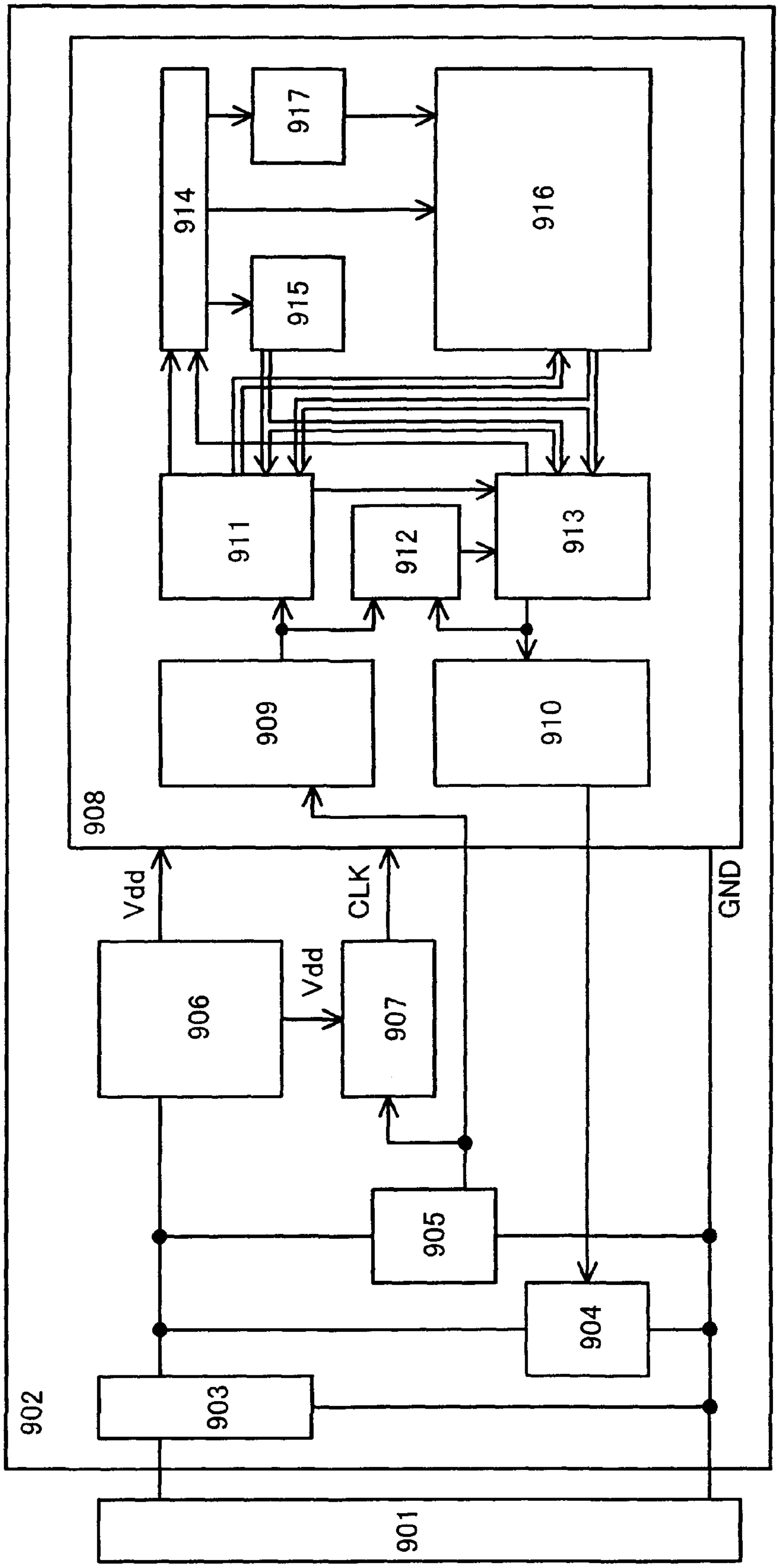
FIG. 9 is a block diagram of a semiconductor device where a semiconductor memory of the present invention is incorporated.

As an application mode of the write-once memory of the present invention, a mode in which a semiconductor device having a wireless communication function is incorporated will be explained. Such a semiconductor device is used, for example, as an RFID tag (radio frequency identification). FIG. 9 shows an example of a block diagram of the semiconductor device.

FIG. 9 shows an RFID tag including an antenna 901 and a semiconductor device 902. It may be considered that the antenna is included in the semiconductor device.

The semiconductor device 902 includes a matching circuit 903, a modulation circuit 904, a demodulation circuit 905, a power supply circuit 906, a phase locked loop 907, and a logic circuit portion 908. The logic circuit portion 908 includes part of an antenna circuit. However, in many cases, the logic circuit portion 908 is composed of logic circuits and is a portion that determines the function of the semiconductor device.

The logic circuit portion 908 includes a decoding circuit 909, an encoding circuit 910, instruction decoder 911, a check circuit 912, an output control circuit 913, a memory control circuit 914, a ROM 915, a write-once memory 916, and a boosting circuit 917.

The matching circuit 903, which is a circuit for obtaining matching of the semiconductor device 902 and the antenna 901, is provided, if necessary. The modulation circuit 904, having a load resistor and a switching element, is a circuit for changing the impedance of a tag in accordance with an input signal. The demodulation circuit 905, which has an envelope circuit, is a circuit for extracting a sub-carrier wave from the received electromagnetic wave. The power supply potential Vdd of the power supply circuit 906, which has a rectifier circuit, a storage capacitor, and a constant voltage circuit, is supplied to the logic circuit portion 908 and the phase locked loop 907. The phase locked loop 907, having a loop filter, a VCO (Voltage Controlled Oscillator), and a frequency dividing circuit, generates a clock signal based on the input of the sub-carrier wave.

The ROM 915 is a read-only-memory for storing identification numbers and various fixed information. A mask ROM or the like can be used. The write-once memory of the present invention is used for the write-once memory 916. By incorporating the write-once memory, data can be added after shipping; therefore, historical information or the like of an object can be made clear by non-contact so as to be of use for manufacturing, management, or the like.

The decoding circuit 909 performs decoding in accordance with the standards of a coded digital signal that is output from the demodulation circuit. The instruction decoder 911 decodes instructions from the decoded signal and outputs various control signals in accordance with data comparison, state changes, and instructions. In addition, the data read from the ROM 915 or the write-once memory is input or the data to be written to the write-once memory is output. The memory control circuit 914, to which the control signal is input, generates a predetermined address, and reading of the ROM 915 or reading or writing of the write-once memory 916 is controlled. The boosting circuit 917 which is necessary at the time of writing of the write-once memory 916 is also controlled.

The output control circuit 913, to which the control signal from the instruction decoder 911 is input, prepares data to be output and performs timing control. The control signal is output to the memory control circuit 914, and the data read from the ROM 915 or the write-once memory is input. The logic circuit portion 908 may have a random number generation circuit that determines a time slot to be output. The check circuit 912, including a CRC (Cyclic Redundancy Check) circuit or a parity check circuit, to which the output signal from the encoding circuit 910 is input, checks whether the receive data is transferred accurately. Moreover, the input signal from the encoding circuit 910 is input, and data capable of checking whether transmit data is transferred accurately is generated. The encoding circuit 910 encodes the data output from the output control circuit 913 in accordance with the standards.

By having such a structure, the semiconductor device in which the write-once memory of the present invention is incorporated can be realized. Such a semiconductor device of the present invention can be used for an RFID tag, for example. By using the semiconductor device of the present invention, data can be added; therefore, historical information or the like of an object can be made clear by non-contact so as to be of use for manufacturing, management, or the like. Moreover, since there are few defects and data is not rewritten, a high level of security is realized.

Further, in the semiconductor device of the present invention, it is preferable to mount an organic write-once memory capable of being formed through a low temperature process. Since the organic write-once memory can be manufactured through a low temperature process, the memory can be formed over a flexible substrate and an application mode thereof as an RFID tag is expanded remarkably.

Note that this embodiment can be implemented by being arbitrarily combined with Embodiment Mode and Embodiments 1 to 3 described above.

Embodiment 5

This embodiment will explain a method for manufacturing the write-once memory of the present invention using an organic memory element over a flexible substrate with reference to FIGS. 11A and 11B and FIGS. 12A and 12B.

Figure 11A:
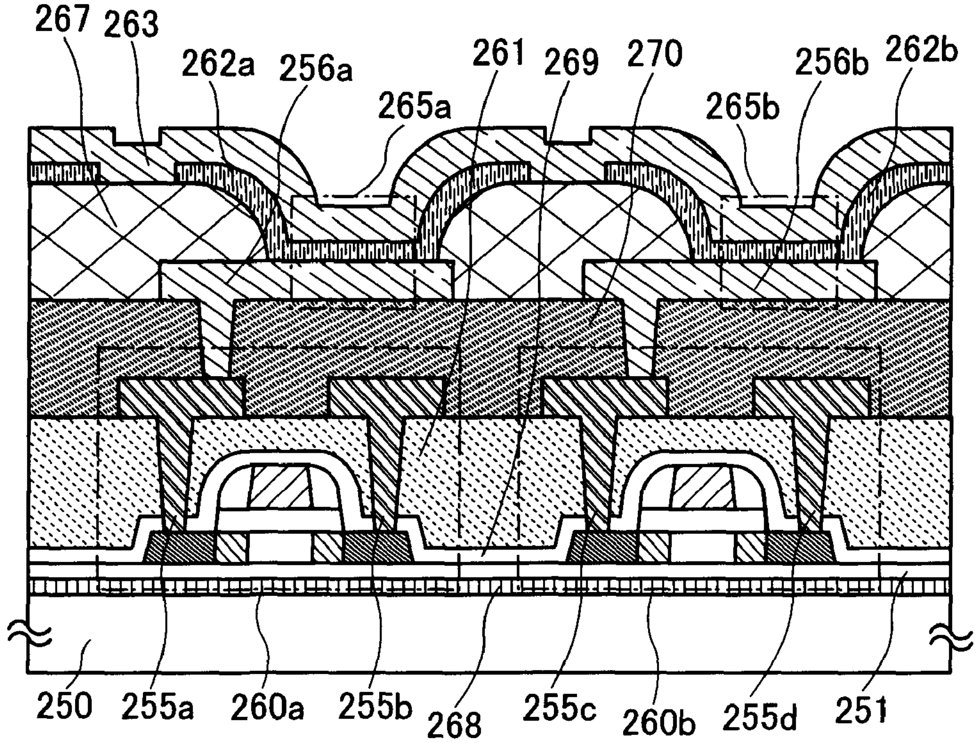
FIGS. 11A and 11B are views each explaining a method for manufacturing a semiconductor device of the present invention.
Figure 11B:
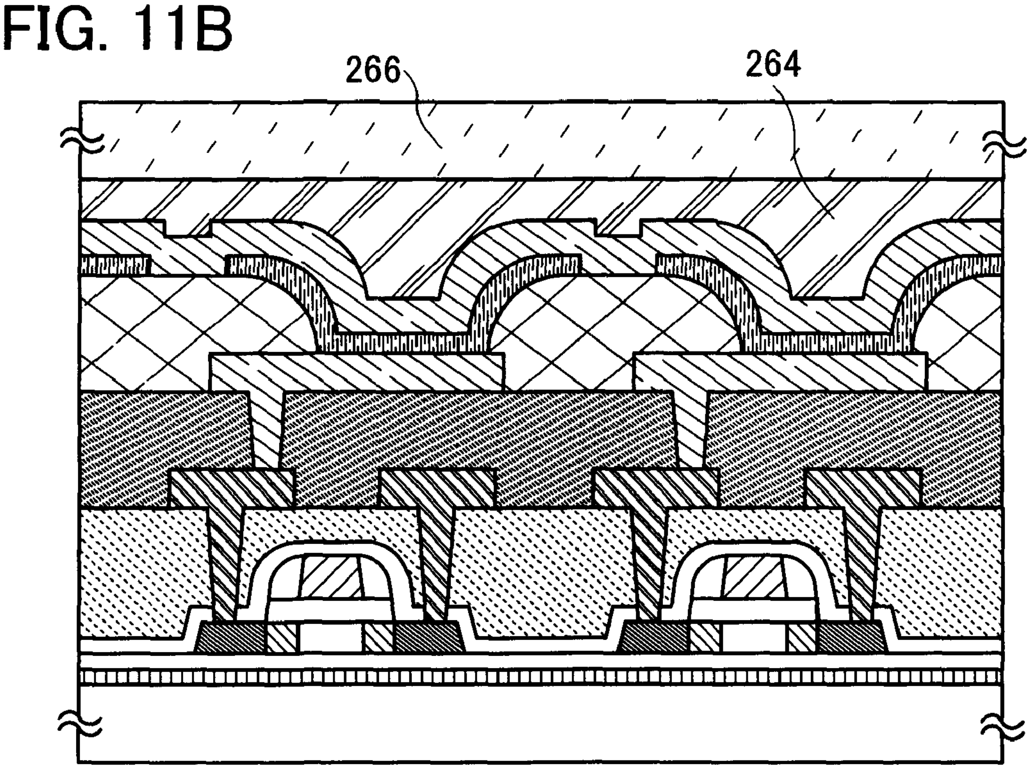

As shown in FIGS. 11A and 11B, a peeling layer 268 and an insulating layer 251 are formed over a substrate 250. Over the insulating layer 251, a transistor 260*a* and a transistor 260*b* are formed. Each of the transistors 260*a* and 260*b* in FIGS. 11A and 11B is a top-gate planar thin film transistor in which a sidewall is provided on an end portion of a gate electrode layer; however, the present invention is not limited to this structure. Over the transistors 260*a* and 260*b*, an insulating layer 269 and an insulating layer 261 are stacked. In the insulating layers 269 and 261, openings reaching each of impurity regions which are source regions and drain regions in semiconductor layers of the transistors 260*a* and 260*b* are formed. In the openings, a wiring layer 255*a*, a wiring layer 255*b*, a wiring layer 255*c*, and a wiring layer 255*d* are formed.

An insulating layer 270 is formed over the wiring layers 255*a*, 255*b*, 255*c*, and 255*d*. In the insulating layer 270, openings each reaching the wiring layers 255*a* and 255*c* are formed. A first conductive layer 256*a* and a first conductive layer 256*b* are formed in the openings, and the first conductive layer 256*a* and the first conductive layer 256*b* are electrically connected to the transistor 260*a* and the transistor 260*b* through the wiring layer 255*a* and the wiring layer 255*c*, respectively.

A partition (an insulating layer) 267 is formed which has openings over the first conductive layer 256*a* and the first conductive layer 256*b* and covers end portions of the first conductive layers 256*a* and 256*b*. An organic compound layer 262*a* is stacked over the first conductive layer 256*a*, while an organic compound layer 262*b* is stacked over the first conductive layer 256*b*, and a second conductive layer 263 is formed over the organic compound layers 262*a* and 262*b* and the partition (insulating layer) 267 (see FIG. 11A). In this manner, a memory element 265*a* including the first conductive layer 256*a*, the organic compound layer 262*a*, and the second conductive layer 263, and a memory element 265*b* including the first conductive layer 256*b*, the organic compound layer 262*b*, and the second conductive layer 263 are provided over the substrate 250.

As the substrate 250, a glass substrate made of barium borosilicate glass, alumino borosilicate glass, or the like; a quartz substrate; a metal substrate or a stainless-steel substrate having an insulating layer over a surface thereof; or a plastic substrate which can withstand the process temperature of the manufacturing process in this embodiment mode is used. The surface of the substrate 250 may be polished by a CMP method or the like so as to be planarized.

The peeling layer 268 is formed by a sputtering method, a plasma CVD method, a coating method, a printing method, or the like, using a single layer or a multi-layer of a layer formed of an element of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si); or an alloy material or a compound material containing any of the elements as its main component. A layer containing silicon may have any of an amorphous structure, a microcrystalline structure, or a polycrystalline structure. Note that a coating method includes a spin-coating method, a droplet discharge method, and a dispensing method in its category here.

In a case where the peeling layer 268 has a single-layer structure, a tungsten layer, a molybdenum layer, or a layer containing a mixture of tungsten and molybdenum is preferably formed. Alternatively, a layer containing oxide or oxynitride of tungsten, a layer containing oxide or oxynitride of molybdenum, or a layer containing oxide or oxynitride of a mixture of tungsten and molybdenum is formed. Note that the mixture of tungsten and molybdenum corresponds to, for example, an alloy of tungsten and molybdenum.

In a case where the peeling layer 268 has a multi-layer structure, preferably, a tungsten layer, a molybdenum layer, or a layer containing a mixture of tungsten and molybdenum is formed as the first layer thereof, and a layer containing tungsten, molybdenum, or oxide, nitride, oxynitride or nitride oxide of a mixture of tungsten and molybdenum is formed as the second layer thereof.

In the case where the peeling layer 268 has a multi-layer structure of a layer containing tungsten and a layer containing tungsten oxide, the layer containing tungsten may be formed first and an insulating layer formed of oxide may be formed over the layer containing tungsten so that a layer containing tungsten oxide can be formed at an interface between the tungsten layer and the insulating layer. Alternatively, thermal oxidization treatment, oxygen plasma treatment, or treatment with a solution having strong oxidizability such as ozone water may be performed to a surface of a layer containing tungsten so that a layer containing tungsten oxide is formed; the plasma treatment or the thermal treatment may be performed in an atmosphere of oxygen, nitrogen, dinitrogen monoxide, an elementary substance of dinitrogen monoxide, or a mixed gas of the gas and another gas. The same can be applied to a case of forming a layer containing a nitride, an oxynitride, or a nitride oxide of tungsten over a layer containing tungsten; after forming the layer containing tungsten, a silicon nitride layer, a silicon oxynitride layer, or a silicon nitride oxide layer is preferably formed.

Tungsten oxide is denoted by WOx. The "x" is within the range of 2 to 3, and there are $WO_2$ (where x is 2), $W_2O_5$ (where x is 2.5), $W_4O_{11}$ (where x is 2.75), $WO_3$ (where x is 3), or the like.

Further, although the peeling layer 268 is formed so as to be in contact with the substrate 250 in the above process, the present invention is not limited to this process. An insulating layer which is a base may be formed so as to be in contact with the substrate 250, and the peeling layer 268 may be formed so as to be in contact with the insulating layer.

The insulating layer 251 is formed using an inorganic compound with a single-layer structure or a multi-layer structure by a sputtering method, a plasma CVD method, a coating method, a printing method, or the like. As a typical example of the inorganic compound, there is oxide of silicon or nitride of silicon. As a typical example of oxide of silicon, there is silicon oxide, silicon oxynitride, silicon nitride oxide, or the like. As a typical example of nitride of silicon, there is silicon nitride, silicon oxynitride, silicon nitride oxide, or the like.

Moreover, the insulating layer 251 may have a multi-layer structure. For example, a multi-layer may be formed by using an inorganic compound; typically, silicon oxide, silicon nitride oxide, and silicon oxynitride may be stacked.

As a material for forming the semiconductor layer included in the transistors 260*a* and 260*b*, an amorphous semiconductor (hereinafter also referred to as an "AS") manufactured using a semiconductor material gas typified by silane or germane by a vapor phase growth method or a sputtering method; a polycrystalline semiconductor that is formed by crystallizing the amorphous semiconductor by utilizing light energy or thermal energy; a semi-amorphous (also referred to as microcrystalline or microcrystal) semiconductor (hereinafter also referred to a "SAS"); or the like can be used. The semiconductor layer can be formed by a known method (a sputtering method, a LPCVD method, a plasma CVD method, or the like).

SAS is a semiconductor having an intermediate structure between an amorphous structure and a crystalline (including a single crystal and a polycrystal) structure and having a third state which is stable in free energy, and contains a crystalline region having short-range order and lattice distortion. The SAS is formed by glow discharge decomposition (plasma CVD) of a gas containing silicon. As the gas containing silicon, $Si_2H_6$, $SiH_2Cl_2$, $SiHCl_3$, $SiCl_4$, $SiF_4$, or the like, as well as $SiH_4$, can be used. Further, $F_2$ or $GeF_4$ may be mixed into the above gas containing silicon. This gas containing silicon may be diluted with $H_2$, or $H_2$ and one or more rare gas elements of He, Ar, Kr, and Ne. Further, as the semiconductor layer, an SAS layer formed using a hydrogen-based gas may be stacked over a SAS layer formed using a fluorine-based gas.

The amorphous semiconductor is typified by hydrogenated amorphous silicon, and the crystalline semiconductor is typified by polysilicon or the like. Polysilicon (polycrystalline silicon) includes so-called high-temperature polysilicon which contains polysilicon that is formed at a process temperature of 800° C. or more as its main component, so-called low-temperature polysilicon which contains polysilicon that is formed at a process temperature of 600° C. or less as its main component, polysilicon which is crystallized by adding an element for promoting crystallization, or the like in its category. As described above, of course, either a semiconductor which contains a crystalline phase in a portion of the semiconductor layer or a semi-amorphous semiconductor can also be used.

Moreover, as a material of the semiconductor, a compound semiconductor such as GaAs, InP, SiC, ZnSe, GaN, or SiGe can be used as well as an elementary substance such as silicon (Si) or germanium (Ge). Further, an oxide semiconductor such as zinc oxide (ZnO) or tin oxide ($SnO_2$) can also be used; in the case of using ZnO for the semiconductor layer, the gate insulating layer may be formed of $Y_2O_3$, $Al_2O_3$, $TiO_2$, a multi-layer thereof, or the like, and the gate electrode layer, the source electrode layer, and the drain electrode layer may be formed of ITO (Indium Tin Oxide), Au, Ti, or the like. In addition, In, Ga, or the like can also be added to ZnO.

In a case where a crystalline semiconductor layer is used as the semiconductor layer, a known method (a laser crystallization method, a thermal crystallization method, a thermal crystallization method using an element for promoting crystallization such as nickel, or the like) may be employed as a manufacturing method of the crystalline semiconductor layer. Alternatively, a microcrystalline semiconductor which is a SAS can be crystallized by laser irradiation to improve the crystallinity. In a case where the element for promoting crystallization is not introduced, hydrogen is released until the concentration of hydrogen contained in an amorphous silicon film becomes less than or equal to $1\times10^{20}$ atoms/$cm^3$ by heating the amorphous silicon film at a temperature of 500° C. for an hour in a nitrogen atmosphere before irradiating the amorphous silicon film with laser light. This is because the amorphous silicon film containing much hydrogen is damaged when the film is irradiated with laser light.

Any method can be used for introducing a metal element to the amorphous semiconductor layer as long as the metal element can exist on a surface of or inside the amorphous semiconductor layer. For example, a sputtering method, a CVD method, a plasma treatment method (including a plasma CVD method), an adsorption method, or a method of coating a metal salt solution can be employed. Among them, the method using a solution is simple, easy, and advantageous in easy control of the concentration of the metal element. In addition, at this time, it is preferable to form an oxide film by UV light irradiation in an oxygen atmosphere, a thermal oxidation method, treatment with ozone water including a hydroxyl radical, or hydrogen peroxide, or the like in order to improve wettability of the surface of the amorphous semiconductor layer and to spread the aqueous solution over the entire surface of the amorphous semiconductor layer.

Further, at the crystallization step for forming a crystalline semiconductor layer by crystallizing the amorphous semiconductor layer, an element (also referred to as a catalytic element or a metal element) which promotes crystallization may be added to the amorphous semiconductor layer, and heat treatment (at temperatures from 550° C. to 750° C. for 3 minutes to 24 hours) may be performed for crystallization. As the metal element which promotes crystallization, one kind or plural kinds of metal elements of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element which promotes crystallization from the crystalline semiconductor layer, a semiconductor layer containing an impurity element is formed in contact with the crystalline semiconductor layer, and the semiconductor layer functions as a gettering sink. As the impurity element, an impurity element imparting n-type conductivity, an impurity element imparting p-type conductivity, a rare gas element, or the like can be used; for example, one kind or plural kinds of elements of phosphorus (P), nitrogen (N), arsenic (As), antimony (Sb), bismuth (Bi), boron (B), helium (He), neon (Ne), argon (Ar), krypton (Kr), and xenon (Xe) can be used. The semiconductor layer containing a rare gas element is formed over the crystalline semiconductor layer containing the element which promotes crystallization, and heat treatment (at temperatures from 550° C. to 750° C. for 3 minutes to 24 hours) is performed. The element which promotes crystallization in the crystalline semiconductor layer moves into the semiconductor layer containing the rare gas element, so that the element which promotes crystallization in the crystalline semiconductor layer is removed or reduced. Thereafter, the semiconductor layer containing the rare gas element, which functions as the gettering sink, is removed.

Heat treatment and laser light irradiation may be combined to crystallize the amorphous semiconductor layer. Alternatively, only one of heat treatment and laser light irradiation may be performed plural times.

Moreover, a crystalline semiconductor layer may be directly formed on the substrate by a plasma method as well. Alternatively, a crystalline semiconductor layer may be selectively formed over the substrate by a plasma method.

The semiconductor layer can be formed using an organic semiconductor material by a printing method, a spray method, a spin-coating method, a droplet discharge method, or the like. In this case, since the above etching step is not required, the number of steps can be reduced. A low-molecular material, a high-molecular material, or the like is used as the organic semiconductor material, and a material such as an organic pigment or a conductive high-molecular material can be used as well. A π-electron conjugated high-molecular material having a skeleton including conjugated double bonds is preferably used as the organic semiconductor material. Typically, a soluble high-molecular material such as polythiophene, polyfluorene, poly(3-alkylthiophene), a polythiophene derivative, or pentacene can be used.

As well as the above, there is a material which can form the semiconductor layer by processing after the deposition of a soluble precursor, as the organic semiconductor material applicable to the present invention. As such an organic semiconductor material, there is polythienylenevinylene, poly(2,5-thienylenevinylene), polyacetyrene, a polyacetyrene derivative, polyarylenevinylene, or the like.

For converting the precursor to an organic semiconductor, a reaction catalyst such as a hydrogen chloride gas is added in addition to heat treatment. The following can be employed as a typical solvent which dissolves the soluble organic semiconductor material: toluene, xylene, chlorobenzene, dichlorobenzene, anisole, chloroform, dichloromethane, γ-butyrlactone, butyl cellosolve, cyclohexane, NMP (N-methyl-2-pyrrolidone), cyclohexanone, 2-butanone, dioxane, dimethylformamide (DMF), THF (tetrahydrofuran), or the like.

The gate electrode layer can be formed by a CVD method, a sputtering method, a droplet discharge method, or the like. The gate electrode layer may be formed of an element of Ag, Au, Cu, Ni, Pt, Pd, Ir, Rh, W, Al, Ta, Mo, Cd, Zn, Fe, Ti, Si, Ge, Zr, and Ba; or an alloy material or a compound material containing any of the elements as its main component. Moreover, a semiconductor film which is typified by a polycrystalline silicon film doped with an impurity element such as phosphorous, or an AgPdCu alloy may be used as well. Further, either a single-layer structure or a multi-layer structure may be employed; for example, a two-layer structure of a tungsten nitride film and a molybdenum film may be employed or a three-layer structure in which a tungsten film with a thickness of 50 nm, a film of an aluminum-silicon alloy (Al—Si) with a thickness of 500 nm, or a titanium nitride film with a thickness of 30 nm are stacked in this order may be employed. In the case of employing a three-layer structure, tungsten nitride may be used instead of the tungsten for the first conductive film, a film of an aluminum-titanium alloy (Al—Ti) may be used instead of the film of an aluminum-silicon alloy (Al—Si) for the second conductive film, and a titanium film may be used instead of the titanium nitride film for the third conductive film.

A light-transmitting material having a transmitting property to visible light can also be used for the gate electrode layer. As the light-transmitting conductive material, indium tin oxide (ITO), indium tin oxide containing silicon oxide (ITSO), organic indium, organic tin, zinc oxide (ZnO), or the like can be used. Moreover, indium zinc oxide (IZO) containing zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used as well.

When etching processing is required to form the gate electrode layer, a mask may be formed and dry etching or wet etching may be performed. The electrode layer can be etched into a tapered shape by using an ICP (Inductively Coupled Plasma) etching method and appropriately adjusting the etching condition (the amount of electric power applied to a coiled electrode, the amount of electric power applied to an electrode on a substrate side, the temperature of the electrode on the substrate side, or the like). As the etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used.

Although the explanation is made of a single gate structure in this embodiment, a multi-gate structure such as a double-gate structure may also be employed. In this case, gate electrode layers may be provided above and below the semiconductor layer or a plurality of gate electrode layers may be provided only one side of (that is, above or below) the semiconductor layer. The semiconductor layer may include impurity regions having different concentrations; for example, a region where the gate electrode layer is stacked in the vicinity of a channel region of the semiconductor layer may be formed to be a low-concentration impurity region, while a region outside the low-concentration impurity region may be formed to be a high-concentration impurity region.

The wiring layers 255*a*, 255*b*, 255*c*, and 255*d* can be formed by forming a conductive layer by a PVD method, a CVD method, an evaporation method, or the like and then etching the conductive layer into a desired shape. In addition, the source electrode layer or the drain electrode layer can be formed selectively in a predetermined position by a printing method, an electric field plating method, or the like. Moreover, a reflow method or a damascene method may also be used. As a material of the source electrode layer or the drain electrode layer, a metal such as Ag, Au, Cu, Ni, Pt, Pd, Ir, Rh, W, Al, Ta, Mo, Cd, Zn, Fe, Ti, Zr, or Ba, a semiconductor such as Si or Ge, or an alloy or a nitride thereof can be used. Further, a light-transmitting material can also be used.

As the light-transmitting conductive material, indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like can be used.

The insulating layer 261, the insulating layer 270, and the partition (insulating layer) 267 may be formed of the following: an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant high molecule such as polyimide, aromatic polyamide, or polybenzimidazole; or a resin material such as a vinyl resin such as polyvinyl alcohol or polyvinyl butyral, an epoxy resin, a phenol resin, a novolac resin, an acrylic resin, a melamine resin, an urethane resin, or a siloxane resin. The acrylic or the polyimide may be either a photosensitive material or a non-photosensitive material. In particular, the partition (insulating layer) 267 is preferably formed into a shape where the curvature radius is continuously changed, so that coverage of the organic compound layers 262*a* and 262*b* and the second conductive layer 263 which are formed over the partition (insulating layer) 267 is improved. The insulating layer can be formed by a CVD method, a plasma CVD method, a sputtering method, a droplet discharge method, a printing method (a method such as screen printing, offset printing, relief printing, or gravure (intaglio) printing), a coating method such as spin coating, a dipping method, or the like.

In this embodiment, as a metal material used for the first conductive layers 256*a* and 256*b*, and the second conductive layer 263, one kind or plural kinds of the following are used: indium (In), tin (Sn), lead (Pb), bismuth (Bi), calcium (Ca), antimony (Sb), and zinc (Zn). Further, one kind or plural kinds of the following are used as well: magnesium (Mg), manganese (Mn), cadmium (Cd), thallium (Tl), tellurium (Te), and barium (Ba). A plurality of the above metal materials may be contained, or an alloy containing one kind or plural kinds of the above materials may be used. In particular, a metal having relatively small solubility parameter, that is, indium (In), tin (Sn), lead (Pb), bismuth (Bi), calcium (Ca), manganese (Mn), or zinc (Zn), or an alloy containing the above metal is suitable as an electrode material. As the alloy capable of being used, there is an indium alloy such as an indium-tin alloy (InSn), a magnesium-indium alloy (InMg), an indium-phosphorus alloy (InP), an indium-arsenic alloy (InAs), or indium-chromium alloy (InCr).

As the organic compound layers 262*a* and 262*b*, the following can be used: polyimide, acrylic, polyamide, benzocyclobutene, polyester, a novolac resin, a melamine resin, a phenol resin, an epoxy resin, a silicon resin, a furan resin, a diallyl phthalate resin, or a siloxane resin.

As another organic compound that can be used for the organic compound layers 262*a* and 262*b*, the following can be used: an aromatic amine compound (namely, a compound having a bond of a benzene ring and nitrogen) such as 4,4'-bis[N-(1-napthyl)-N-phenylamino]-biphenyl (abbreviation: α-NPD), 4,4'-bis[N-(3-methylphenyl)-N-phenyl-amino]-biphenyl (abbreviation: TPD), 4,4',4"-tris(N,N-diphenyamino)-triphenylamine (abbreviation: TDATA), 4,4',4"-tris[N-(3-methylphenyl)-N-phenyl-amino]-triphenylamine (abbreviation: MTDATA), or 4,4'-bis(N-(4-(N,N-di-m-tolylamino)phenyl)-N-phenylamino)biphenyl (abbreviation: DNTPD); a phthalocyanine compound such as phthalocyanine (abbreviation: $H_2Pc$), copper phthalocyanine (abbreviation: CuPc), or vanadyl phthalocyanine (abbreviation: VOPc); 2Me-TPD; FTPD; TPAC; OTPAC; Diamine; PDA; triphenylmethane (abbreviation: TPM); STB; or the like.

As another organic compound that can be used for the organic compound layers 262*a* and 262*b*, the following can be used: a material made of a metal complex or the like having a quinoline skeleton or a benzoquinoline skeleton such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq); a material made of a metal complex or the like having an oxazole based or thiazole based ligand such as bis[2-(2-hydroxyphenyl)benzoxazolato]zinc (abbreviation: $Zn(BOX)_2$), or bis[2-(2-hydroxyphenyl)benzothiazolato]zinc (abbreviation: $Zn(BTZ)_2$); 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); 5,6,11,12-tetraphenyltetracene (abbreviation: rubrene); hexaphenylbenzene; t-butylperylene; 9,10-di(phenyl)anthracene; coumarin 545T; dendrimer; 4-dicyanomethylene-2-methyl-6-[2-(1,1,7,7-tetramethyl-9-julolidyl)ethenyl]-4H-pyran (abbreviation: DCJT); 4-dicyanomethylene-2-t-butyl-6-[2-(1,1,7,7-tetramethyljulolidin-9-yl)ethenyl]-4H-pyran (abbreviation: DCJTB); periflanthene; 2,5-dicyano-1,4-bis[2-(10-methoxy-1,1,7,7-tetramethyljulolidin-9-yl)ethenyl]benzene; N,N'-dimethylquinacridone (abbreviation: DMQd); coumarin 6; 9,9'-bianthryl; 9,10-diphenylanthracene (abbreviation: DPA); 9,10-bis(2-naphthyl)anthracene (abbreviation: DNA); 2,5,8,11-tetra-t-butylperylene (abbreviation: TBP); BMD; BDD; 2,5-bis(1-naphthyl)-1,3,4-oxadiazol (abbreviation: BND); BAPD; BBOT; TPQ1; TPQ2; MBDQ; or the like.

As another organic compound that can be used for the organic compound layers 262*a* and 262*b*, polyacetylene, polyphenylenevinylene, polythiophene, polyaniline, polyphenyleneethynylene, or the like can be used. Polyparaphenylenvinylene includes in its category a derivative of poly(paraphenylenvinylene) [PPV], poly(2,5-dialkoxy-1,4-phenylenevinylene) [RO-PPV], poly(2-(2'-ethyl-hexoxy)-5-methoxy-1,4-phenylenevinylene) [MEH-PPV], poly(2-(dialkoxyphenyl)-1,4-phenylenevinylene) [ROPh-PPV], or the like. Polyparaphenylen includes in its category a derivative of polyparaphenylen [PPP], poly(2,5-dialkoxy-1,4-phenylene) [RO-PPP], poly(2,5-dihexoxy-1,4-phenylene), or the like. Polythiophene includes in its category a derivative of polythiophene [PT], poly(3-alkylthiophene) [PAT], poly(3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene] [POPT], poly[3-(4-octylphenyl)-2,2'bithiophene] [PTOPT], or the like. Polyfluorenee includes in its category a derivative of polyfluorenee [PF], poly(9,9-dialkylfluorene) [PDAF], poly(9,9-dioctylfluorene) [PDOF)], or the like.

As another organic compound that can be used for the organic compound layers 262*a* and 262*b*, the following can be used: PFBT, a carbazole derivative, anthracene, coronene, peryrene, PPCP, BPPC, Boryl Anthracene, DCM, QD, Eu(TTA)3Phen, or the like.

One kind or plural kinds of the above organic compounds can be used as an organic compound that can be used for the organic compound layers 262*a* and 262*b*.

Next, as shown in FIG. 11B, an insulating layer 264 is formed over the second conductive layer 263. Then, a substrate 266 is attached to the surface of the insulating layer 264.

The insulating layer 264 is preferably formed by coating a composition using a coating method and then drying and heating. The insulating layer 264 which is provided as a protection layer used at a later peeling step is preferably an insulating layer with less unevenness on the surface. Such an insulating layer 264 can be formed by a coating method. Alternatively, an insulating film may be formed by a thin-film forming method such as CVD or sputtering, and a surface thereof may be polished by a CMP method to form the insulating layer 264. The insulating layer 264 formed using the coating method is formed of the following: an organic compound such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallylphthalate resin; an inorganic siloxane polymer including a Si—O—Si bond among compounds including silicon, oxygen, and hydrogen formed by using a siloxane polymer-based material typified by silica glass as a starting material; or an organic siloxane polymer in which hydrogen bonded to silicon is substituted by an organic group such as methyl or phenyl, typified by an alkylsiloxane polymer, an alkylsilsesquioxane polymer, a silsesquioxane hydride polymer, or an alkylsilsesquioxane hydride polymer. The insulating layer formed by the above thin-film forming method, which is then subjected to surface polishing by a CMP method, is formed of silicon oxide, silicon oxynitride, silicon nitride oxide, silicon nitride, or the like. The insulating layer 264 is not necessarily formed, and the substrate 266 may be directly attached to the second conductive layer 263.

A flexible substrate which is thin and lightweight is preferably used as the substrate 266. Typically, a substrate made from PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like can be used. Moreover, paper made from a fibrous material; a multilayer film of a base material film (polyester, polyamide, an inorganic evaporated film, paper, or the like) and an adhesive organic resin film (an acrylic-based organic resin, an epoxy-based organic resin, or the like); or the like can also be used. In the case of using the above substrate, the insulating layer 264 and the substrate 266 may be attached to each other by providing an adhesion layer, though not shown, between the insulating layer 264 and the substrate 266.

Alternatively, a film having an adhesion layer (made from polypropylene, polyester, vinyl, polyvinyl fluoride, vinyl chloride, or the like) which is attached to an object to be processed by thermocompression may be used as the substrate 266. Such a film can be attached to an object to be processed by melting the adhesion layer provided in the outermost surface of the film or a layer (which is not the adhesion layer) provided in the outermost layer of the film by heat treatment and then by applying pressure thereto. In this case, the adhesion layer is not necessarily provided between the insulating layer 264 and the substrate 266.

Here, the insulating layer 264 is formed in the following manner: a compositing containing an epoxy resin is coated by a coating method, and then is dried and baked. Next, the substrate 266 is attached over the insulating layer 264 by thermocompressing the film to the surface of the insulating layer 264.

Figure 12A:
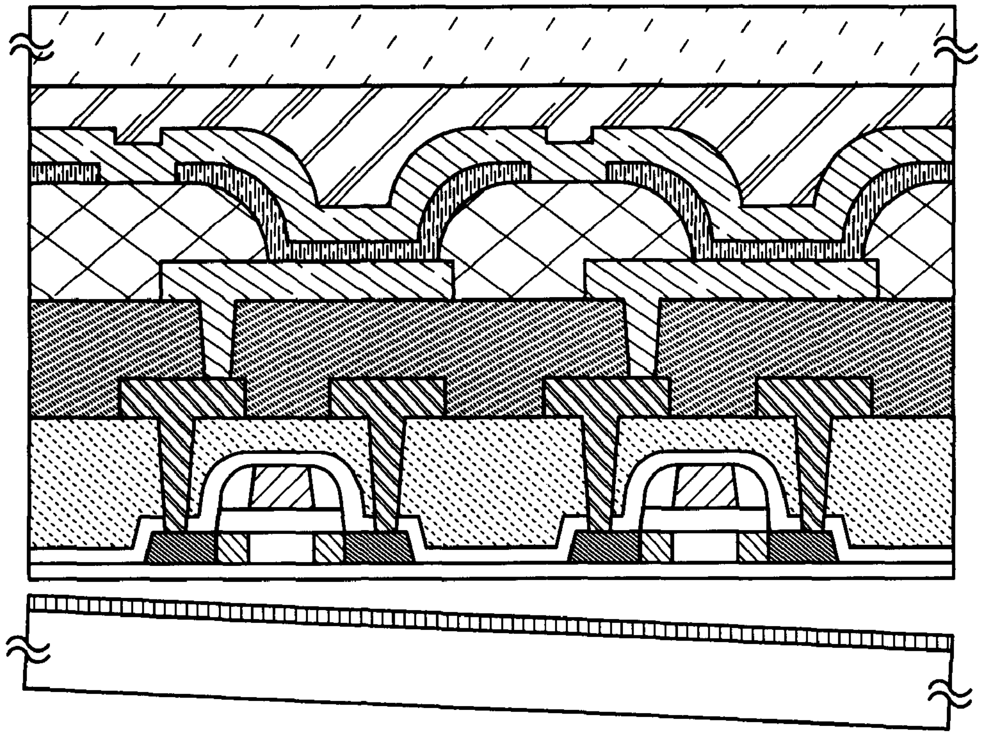
FIGS. 12A and 12B are views each explaining a method for manufacturing a semiconductor device of the present invention.

Then, as shown in FIG. 12A, the peeling layer 268 and the insulating layer 251 are peeled off from each other. In this manner, an element-formed layer including a memory element and a circuit portion is peeled from the substrate 250, and transposed to the insulating layer 264 and the substrate 266.

Although this embodiment uses a method for peeling the element-formed layer, in which the peeling layer and the insulating layer are formed between the substrate and the element-formed layer, the metal oxide film is provided between the peeling layer and the insulating layer, and the metal oxide film is weakened by crystallization, the present invention is not limited thereto. Any of the following methods can also be appropriately used: (1) a method in which an amorphous silicon film containing hydrogen is provided between a substrate having high heat resistance and an element-formed layer, and the amorphous silicon film is irradiated with laser light or etched to remove the amorphous silicon film, thereby peeling the element-formed layer; (2) a method in which a peeling layer and an insulating layer are formed between a substrate and an element-formed layer, a metal oxide film is provided between the peeling layer and the insulating layer, the metal oxide film is weakened by crystallization, part of the peeling layer is etched away using a solution or a halogen fluoride gas such as $NF_3$, $BrF_3$, or $ClF_3$, and peeling is performed at the weakened metal oxide film; (3) a method in which a substrate over which an element-formed layer is formed is mechanically removed or is etched away using a solution or a halogen fluoride gas such as $NF_3$, $BrF_3$, or $ClF_3$; or the like. Alternatively, a method in which a film containing nitrogen, oxygen, or hydrogen (for example, an amorphous silicon film containing hydrogen, an alloy film containing hydrogen, or an alloy film containing oxygen) is used as a peeling layer, and the peeling layer is irradiated with laser light to release the nitrogen, oxygen, or hydrogen contained in the peeling layer, thereby promoting peeling between an element-formed layer and a substrate, may be used.

By combining the above peeling methods, the transposing step can be more easily performed. In other words, peeling can also be performed with physical force (by a human hand, a machine, or the like) after performing laser light irradiation; etching to the peeling layer with a gas, a solution, or the like; or mechanical removal with a sharp knife, scalpel, or the like, so as to create a condition where the peeling layer and the element-formed layer can be easily peeled off from each other. Moreover, the above peeling methods are examples, and the present invention is not limited thereto. By applying the present invention, an element can be transposed with a favorable state because the element is not damaged by force applied at a peeling step.

Figure 12B:
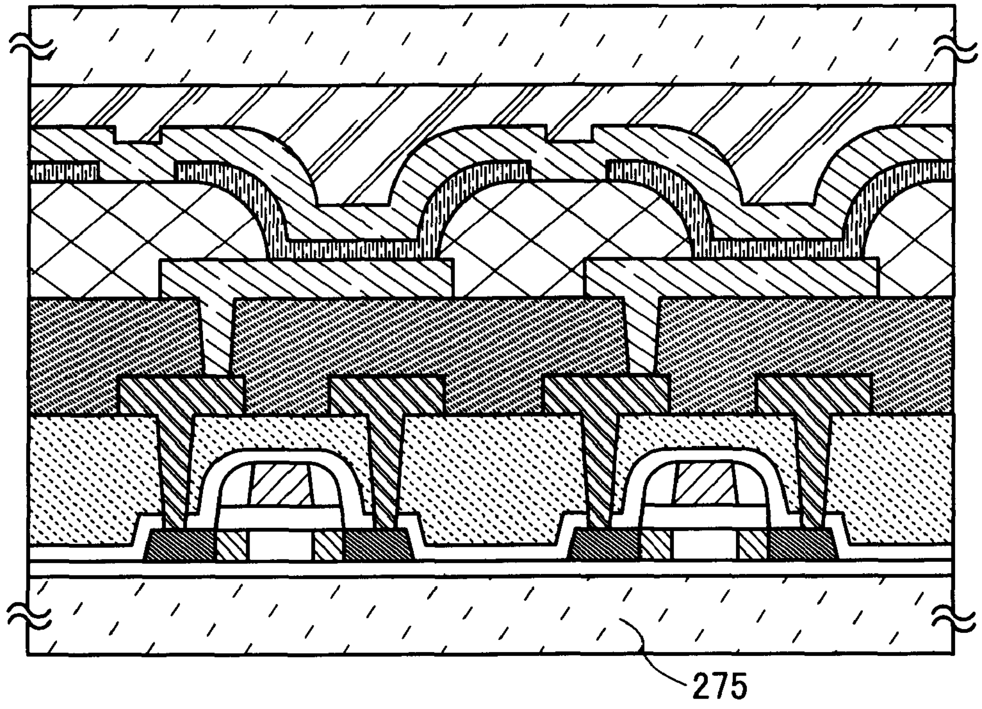

Next, as shown in FIG. 12B, a substrate 275 is attached to the surface of the insulating layer 251. The same as the substrate 266 can be appropriately used as the substrate 275. Here, the substrate 275 is attached to the insulating layer 251 by thermocompression of a film.

Note that, after the element-formed layer including the memory element is transposed to the substrate 266, the element-formed layer may be peeled from the substrate 266 again. For example, the element-formed layer may be peeled from the substrate 250 which is a first substrate, transposed to the substrate 266 which is a second substrate, and transposed to the substrate 275 which is a third substrate, and then the substrate 266 which is the second substrate may be peeled from the element-formed layer.

As for the memory element 265*a* including the first conductive layer 256*a*, the organic compound layer 262*a*, and the second conductive layer 263 described in this embodiment, and the memory element 265*b* including the first conductive layer 256*b*, the organic compound layer 262*b*, and the second conductive layer 263, since adhesion inside each memory element is favorable, a defect such as film peeling does not occur at an interface between the layers by force applied at a step of transposition to the substrate 266 which is the second substrate after the formation over the substrate 250 which is the first substrate. Consequently, the memory element can be peeled off and transposed with a preferable shape, to manufacture a semiconductor device.

As described through the above manufacturing method, the write-once memory of the present invention using an organic element can be manufactured over a flexible substrate. Accordingly, it is possible to realize a write-once memory of the present invention where there are few defects and no concern for rewriting data, which is superior in an application mode.

Note that this embodiment can be implemented by being arbitrarily combined with Embodiment Mode and Embodiments 1 to 3 described above.

Embodiment 6

Figure 13A:
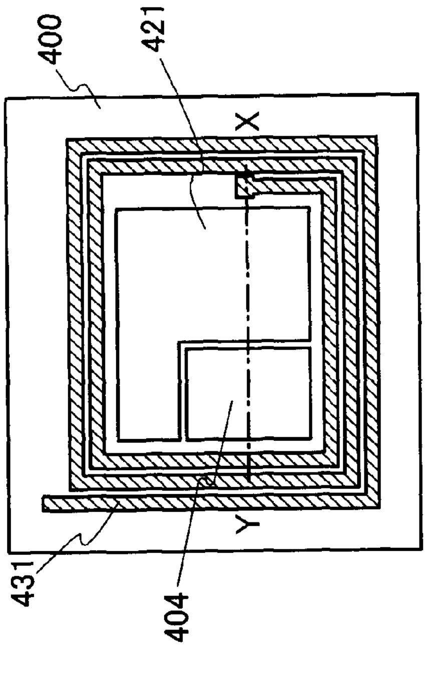
FIGS. 13A and 13B are each a top view and a cross-sectional view of a semiconductor device of the present invention.

Regarding an example of the semiconductor device of the present invention, this embodiment will explain an example of a semiconductor device having a wireless communication function where an organic write-once memory is formed over a flexible substrate with reference to drawings. FIG. 13A shows a top view of a semiconductor device of this embodiment mode, and FIG. 13B shows a cross-sectional view taken along a line X-Y in FIG. 13A.

As shown in FIG. 13A, a memory element portion 404 which is a semiconductor device including a memory element, a circuit portion 421, and an antenna 431 are formed over a substrate 400. A state shown in FIGS. 13A and 13B is in the middle of a manufacturing process, in which the memory element portion, the circuit portion, and the antenna have been formed over the substrate 400 capable of resisting the manufacturing condition. The material and manufacturing process may be selected in the same manner as Embodiment Mode 4 for manufacturing.

Over the substrate 400, a transistor 441 is provided in the memory element portion 404 while a transistor 442 is provided in the circuit portion 421, with a peeling layer 452 and an insulating layer 453 interposed therebetween. Insulating layers 461, 454, and 455 are formed over the transistors 441 and 442, and a memory element 443 structured by the stack of a first conductive layer 457*d*, an organic compound layer 458, and a second conductive layer 459 is formed over the insulating layer 455. The organic compound layer 458 is separated individually by an insulating layer 460*b* serving as a partition. The first conductive layer 457*d* is connected to a wiring layer of the transistor 441, so that the memory element 443 is electrically connected to the transistor 441.

Figure 13B:
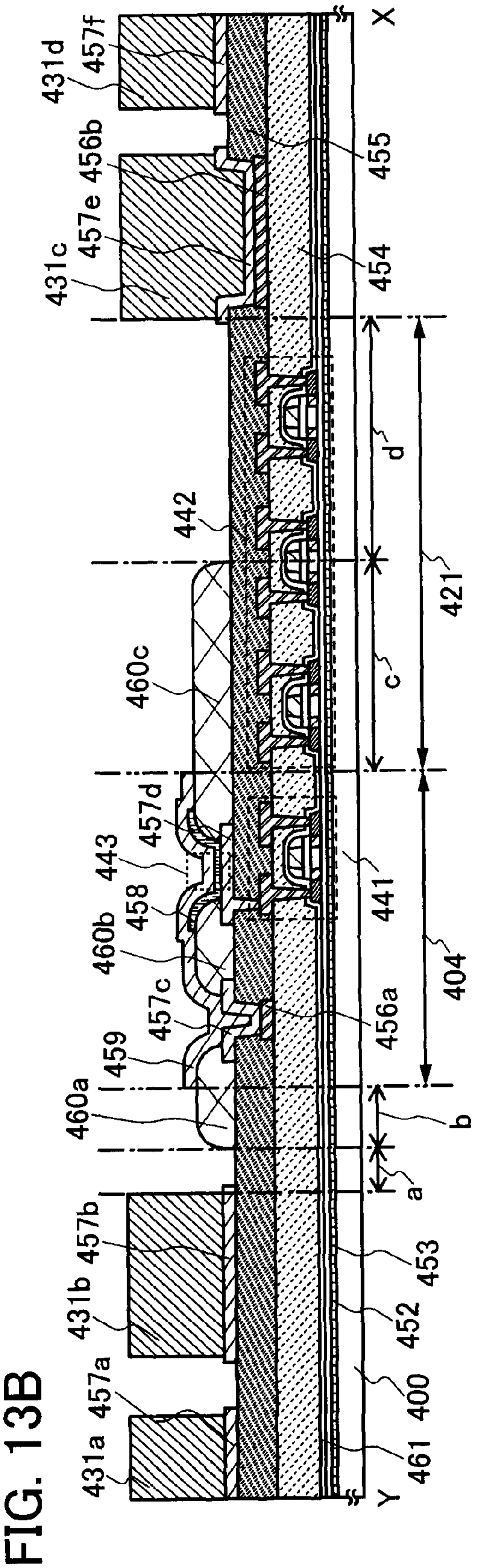
Figure 14A:
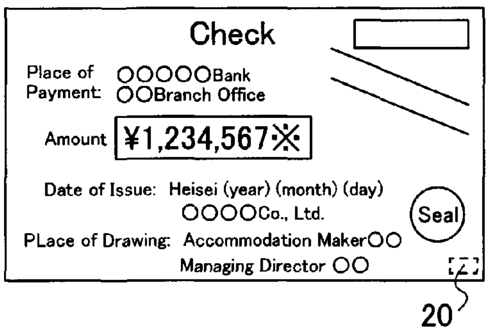
FIGS. 14A to 14H are views each showing an application mode of a semiconductor device of the present invention.
Figure 14B:
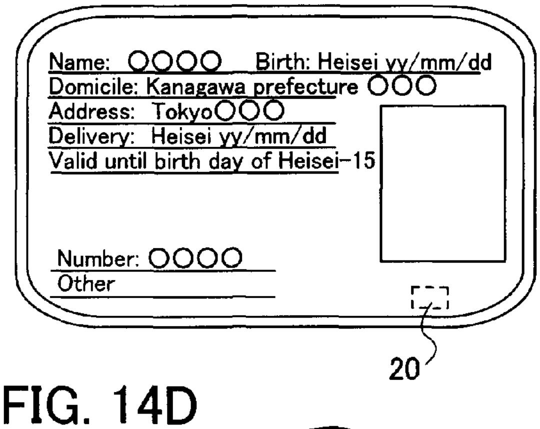
Figure 14C:
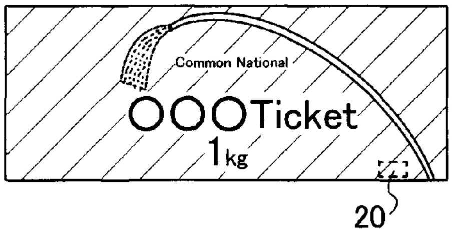
Figure 14D:
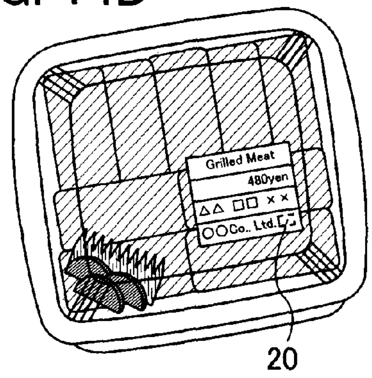
Figure 14E:
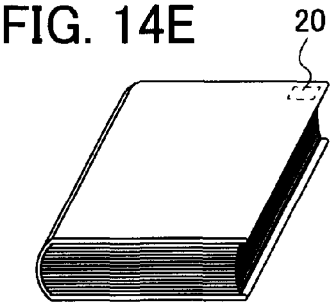
Figure 14F:
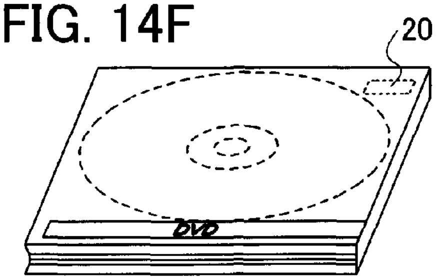
Figure 14G:
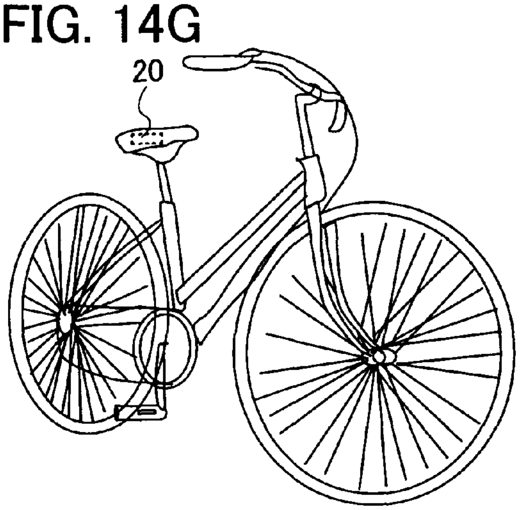
Figure 14H:
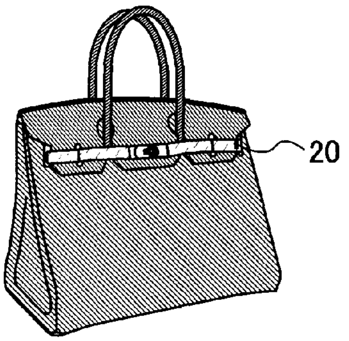

In the semiconductor device shown in FIG. 13B, the second conductive layer 459 is stacked over a wiring layer 456*a* and a conductive layer 457*c* so as to electrically connect to each other. Over the insulating layer 455, each of a conductive layer 457*a* and an antenna 431*a*, a conductive layer 457*b* and an antenna 431*b*, a conductive layer 457*e* and an antenna 431*c*, and a conductive layer 457*f* and an antenna 431*d* are stacked. The conductive layer 457*e* is formed in contact with a wiring layer 456*b* in an opening which is formed in the insulating layer 455 so as to reach the wiring layer 456*b*, which electrically connect the antenna to the memory element portion 404 and the circuit portion 421. The conductive layers 457*a*, 457*b*, 457*e*, and 457*f* under the antennas 431*a*, 431*b*, 431*c*, and 431*d* also improve adhesion between the insulating layer 455 and the antennas 431*a*, 431*b*, 431*c*, and 431*d*. In this embodiment, a polyimide film is used as the insulating layer 455, a titanium film is used as each of the conductive layers 457*a*, 457*b*, 457*e*, and 457*f*, and an aluminum film is used as each of the antennas 431*a*, 431*b*, 431*c*, and 431*d*.

Openings (also called contact holes) are formed in the insulating layer 455 such that the first conductive layer 457*d* and the transistor 441, the conductive layer 457*c* and the wiring layer 456*a*, and the conductive layer 457*e* and the wiring layer 456*b* are connected to each other. Since resistance is decreased as the contact area between conductive layers are increased by enlarging the opening, the openings are set in this embodiment such that the opening for connecting the first conductive layer 457*d* to the transistor 441 is the smallest, the opening for connecting the conductive layer 457*c* to the wiring layer 456*a* is followed, and the opening for connecting the conductive layer 457*e* to the wiring layer 456*b* is the largest. In this embodiment, the opening for connecting the first conductive layer 457*d* to the transistor 441 is 5 μm×5 μm, the opening for connecting the conductive layer 457*c* to the wiring layer 456*a* is 50 μm×50 μm, and the opening for connecting the conductive layer 457*e* to the wiring layer 456*b* is 500 μm×500 μm.

In this embodiment, distance a from the insulating layer 460*a* to the antenna 431*b* is greater than or equal to 500 μm, distance b from the end portion of the second conductive layer 459 to the end portion of the insulating layer 460*a* is greater than or equal to 250 μm, distance c from the end portion of the second conductive layer 459 to the end portion of the insulating layer 460*c* is greater than or equal to 500 μm, and distance d from the end portion of the insulating layer 460*c* to the antenna 431*c* is greater than or equal to 250 μm. The insulating layer 460*c* is formed partially in the circuit portion 421; thus, part of the transistor 442 is covered with the insulating layer 460*c* and the other part thereof is not covered with the insulating layer 460*c*.

By using such a semiconductor device, a power supply voltage or a signal is input directly to the memory element portion 404 from an external input portion, so that data (corresponding to information) can be written to or read from the memory element portion 404.

In addition, in a case where a signal is not directly input to the external input portion 403, a power supply and a signal can be generated internally through the RF input portion from an electric wave received by the antenna portion, so that data can be read from the memory element portion 404.

Moreover, the antenna may be provided either so as to overlap the memory element portion or so as to surround the memory element portion without overlapping the memory element portion. In the case of overlapping the memory element portion, the antenna may overlap the memory element portion either entirely or partially. A structure where an antenna portion and a memory element portion are overlapped each other improves reliability because defective operation of a semiconductor device caused by noise or the like superposed on a signal when communication is performed by the antenna, or fluctuation or the like of electromotive force generated by electromagnetic induction can be reduced. In addition, the semiconductor device can also be downsized.

As a signal transmission system in the above semiconductor device that is capable of transmitting and receiving data in a non-contact manner, an electromagnetic coupling system, an electromagnetic induction system, a microwave system, or the like can be used. The transmission system can be appropriately selected considering an intended use, and an optimum antenna may be provided in accordance with the transmission system.

For example, when an electromagnetic coupling system or an electromagnetic induction system (for example, a 13.56 MHz band) is used as the signal transmission system in the semiconductor device, electromagnetic induction caused by change in magnetic field density is utilized; therefore, a conductive layer serving as an antenna is formed into an annular shape (for example, a loop antenna) or a spiral shape (for example, a spiral antenna).

When a microwave system (for example, an UHF band (a 860 to 960 MHz band), a 2.45 GHz band, or the like) is used as the signal transmission system in the semiconductor device, the shape such as the length of the conductive layer serving as an antenna may be appropriately set considering the wavelength of an electromagnetic wave used for signal transmission. For example, the conductive layer serving as an antenna can be formed into a linear shape (for example, a dipole antenna), a flat shape (for example, a patch antenna), a ribbon shape, or the like. The shape of the conductive layer serving as an antenna is not limited to the form of a line; the conductive layer serving as an antenna may also be provided in the form of a curve, a meander, or a combination of them, considering the wavelength of the electromagnetic wave.

The conductive layer serving as an antenna is formed of a conductive material by a CVD method, a sputtering method, a printing method such as screen printing or gravure printing, a droplet discharge method, a dispensing method, a plating method, or the like. The conductive layer is formed with a single-layer structure or a multi-layer structure of an element of aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing the element as its main component.

In the case of forming the conductive layer serving as an antenna by using a screen printing method, for example, the conductive layer can be provided by selectively printing conductive paste in which conductive particles each having a particle size of several nm to several tens of μm are dissolved or dispersed in an organic resin. As the conductive particle, a metal particle of one or more of silver (Ag), gold (Au), copper (Cu), nickel (Ni), platinum (Pt), palladium (Pd), tantalum (Ta), molybdenum (Mo), and titanium (Ti), a fine particle of silver halide, or a dispersive nanoparticles can be used. In addition, as the organic resin included in the conductive paste, one or a plurality of organic resins each serving as a binder, a solvent, a dispersant, or a coating member of the metal particle can be used. Typically, an organic resin such as an epoxy resin or a silicon resin can be used. When forming the conductive layer, baking may be preferably performed after the conductive paste is applied. For example, in the case of using fine particles (for example, the particle size is greater than or equal to 1 nm and less than or equal to 100 nm) containing silver as its main component, as a material of the conductive paste, the conductive layer can be obtained by curing by baking at temperatures of 150 to 300° C. Alternatively, fine particles containing solder or lead-free solder as its main component may be used. In this case, it is preferable to use a fine particle having a particle size of less than or equal to 20 μm. Solder or lead-free solder has an advantage of low cost. Moreover, besides the above materials, ferrite or the like may be applied to the antenna.

In addition, in the case of applying an electromagnetic coupling system or an electromagnetic induction system, and providing a semiconductor device having an antenna, in contact with metal, a magnetic material having magnetic permeability is preferably provided between the semiconductor device and the metal. In the case of providing a semiconductor device having an antenna, in contact with metal, an eddy current flows in the metal in accordance with change in magnetic field, and a demagnetizing field generated by the eddy current impairs the change in magnetic field to reduce the communication distance. Therefore, by providing a material having magnetic permeability between the semiconductor device and the metal, eddy current of the metal can be suppressed, thereby suppressing reduction in communication distance. Note that ferrite or a metal thin film having high magnetic permeability and little loss of high frequency wave can be used as the magnetic material.

Moreover, when providing an antenna, a semiconductor element such as a transistor and a conductive layer serving as an antenna may be directly formed on one substrate, or alternatively, a semiconductor element and a conductive layer serving as an antenna may be provided over different substrates and then attached to be electrically connected to each other.

As for the memory element 443 including the first conductive layer 457*d*, the organic compound layer 458, and the second conductive layer 459 described in this embodiment, since adhesion within the memory element is favorable, a defect such as film peeling does not occur at an interface between the layers by force applied at a step of transposition to the second substrate after the formation over the substrate 400 which is the first substrate. Consequently, the memory element can be peeled off and transposed with a preferable shape, to manufacture a semiconductor device.

As described through the above manufacturing method, a semiconductor device where the write once memory of the present invention is incorporated over a flexible substrate can be manufactured. Such a semiconductor device of the present invention can be used, for example, as an RFID tag. By using the semiconductor device of the present invention, data can be added; therefore, historical information or the like of an object can be made clear by non-contact so as to be of use for manufacturing, management, or the like. Moreover, since there are few defects and data is not rewritten, a high level of security is realized. Further, by forming the write-once memory of the present invention over a flexible substrate, an application mode thereof as an RFID tag is expanded remarkably.

Note that this embodiment can be implemented by being arbitrarily combined with Embodiment Mode and Embodiments 1 to 4 described above.

Embodiment 7

The application of the semiconductor device where the nonvolatile memory of the present invention is incorporated is widespread, capable of being applied to any product as long as it is a product that makes historical information or the like of an object clear by non-contact so as to be of use for manufacturing, management, or the like. As shown in FIGS. 14A to 14H, a semiconductor device 20 of the present invention can be used by being provided for paper money, coins, securities, certificates, bearer bonds, packaging containers, books, recording media, personal belongings, vehicles, foods, clothing, health products, commodities, chemicals, electronic devices, or the like.

Paper money and coins are money circulated in the market and include in its category ones (cash vouchers) similar to currency that are valid in a certain area, memorial coins, or the like. Securities refer to checks, certificates, promissory notes, or the like (see FIG. 14A). Certificates refer to driver's licenses, certificates of residence, or the like (see FIG. 14B). Bearer bonds refer to stamps, rice coupons, various gift certificates, or the like (see FIG. 14C). Packaging containers refer to wrapping paper for food containers or the like, plastic bottles, or the like (see FIG. 14D). Books refer to hardbacks, paperbacks, or the like (see FIG. 14E). Recording media refer to DVD software, video tapes, or the like (see FIG. 14F). Vehicles refer to wheeled vehicles such as bicycles, ships, or the like (see FIG. 14G). Personal belongings refer to bags, glasses, or the like (see FIG. 14H). Food refers to food articles, beverages, or the like. Clothing refers to clothes, footwear, or the like. Health products refer to medical instruments, health instruments, or the like. Commodities refer to furniture, lighting equipment, or the like. Chemical refers to medical products, pesticides, or the like. Electronic devices refer to liquid crystal display devices, EL display devices, television devices (a television receiver or a flat-screen television), cellular phones, or the like.

Forgery can be prevented by the semiconductor device described in the above embodiment being provided for paper money, coins, securities, certificates, bearer bonds, or the like. In addition, efficiency of an inspection system, a system used in a rental shop, or the like can be improved by providing the semiconductor device described in the above embodiment for packaging containers, books, recording media, personal belongings, foods, commodities, chemicals, electronic devices, or the like. Forgery or theft can be prevented by the semiconductor device described in the above embodiment being provided for vehicles, health products, chemicals, or the like; further, for chemicals, taking medicine mistakenly can be prevented. The semiconductor device can be provided by being attached to the surface or by being embedded therein. For example, for books, the semiconductor device may be embedded in a piece of paper; for packages made from organic resin, the semiconductor device may be embedded in the organic resin. In addition, when subsequently performing additional writing (postscript) in addition to an optical operation, a memory element provided on a chip is preferably formed of a transparent material so that a portion thereof can be irradiated with light. Further, forgery can be effectively prevented by using a memory element which is incapable of rewriting data once written. Furthermore, the problem of user privacy after purchase of a product can be solved by providing a system for erasing data of a memory element which is provided in the semiconductor device.

In such a manner, efficiency of an inspection system, a system used in a rental shop, or the like can be improved by the semiconductor device described in the above embodiment being provided for packaging containers, recording media, personal belongings, foods, clothing, commodities, electronic devices, or the like. In addition, forgery or theft can be prevented by the semiconductor device described in the above embodiment being provided for vehicles. Moreover, an individual creature can be easily identified by the semiconductor device being implanted in a creature such as an animal. For example, by the semiconductor device with a sensor being implanted in a creature such as livestock, its health condition such as current body temperature as well as its birth year, sex, breed, or the like can be easily managed. Further, through control to make the communication range of the semiconductor device short, information being looked at secretly by a third party can be prevented.

As described through the above, the semiconductor device of the present invention can be used by being provided for any product. Note that this embodiment can be implemented by being arbitrarily combined with Embodiment Mode and Embodiments 1 to 6 described above.

The present application is based on Japanese Patent Application serial No. 2005-377260 filed on Dec. 28, 2005 in Japanese Patent Office, the entire contents of which are hereby incorporated by reference.

What is claimed is:

1. A nonvolatile memory comprising:

a memory cell array comprising:

a plurality of first memory cells; and at least one second memory cell;

a first reading writing circuit for writing data to the plurality of first memory cells and the second memory cell;

a second writing circuit; and a verify circuit for confirming whether the data is normally stored in the plurality of first memory cells, wherein, when the writing of data to one of the plurality of first memory cells fails, the second writing circuit is arranged to assign an address of the one of the plurality of first memory cells to the second memory cell, wherein the plurality of first memory cells and the second memory cell are arranged to irreversibly change the electrical resistance thereof when the data is stored therein, and wherein the plurality of first memory cells and the second memory cell each comprise an organic compound layer interposed between a pair of electrodes.

2. The nonvolatile memory according to claim 1, wherein the nonvolatile memory further comprises a timing control circuit for controlling the first reading writing circuit, the second writing circuit, and the verify circuit.

3. The nonvolatile memory according to claim 1, wherein the nonvolatile memory has an antenna which is capable of receiving an electric wave.

4. The nonvolatile memory according to claim 1, wherein each of the plurality of first memory cells and the second memory cell is a write-once memory to which the data can be written only once.

5. The nonvolatile memory according to claim 1, wherein the nonvolatile memory is formed over a flexible substrate.

6. The nonvolatile memory according to claim 1, wherein the first reading writing circuit is arranged to write data to the second memory cell to which the address is assigned.

7. The nonvolatile memory according to claim 1, wherein the organic compound layer comprises an organic compound selected from the group consisting of an aromatic amine derivative, a phthalocyanine derivative, an organometallic compound, and a carbazole derivative.

8. The nonvolatile memory according to claim 1, wherein the nonvolatile memory has an antenna for receiving an electric wave to provide a power supply voltage by which data writing and data reading are performed.

* * * * *